(12) United States Patent
Iijima et al.

(10) Patent No.: US 8,432,721 B2
(45) Date of Patent: Apr. 30, 2013

(54) METHOD OF PROGRAMMING VARIABLE RESISTANCE ELEMENT, METHOD OF INITIALIZING VARIABLE RESISTANCE ELEMENT, AND NONVOLATILE STORAGE DEVICE

(75) Inventors: Mitsuteru Iijima, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/201,890

(22) PCT Filed: Feb. 1, 2011

(86) PCT No.: PCT/JP2011/000545
§ 371 (c)(1),
(2), (4) Date: Aug. 17, 2011

(87) PCT Pub. No.: WO2011/096194
PCT Pub. Date: Aug. 11, 2011

(65) Prior Publication Data
US 2011/0299322 A1     Dec. 8, 2011

(30) Foreign Application Priority Data
Feb. 2, 2010  (JP) .................................. 2010-021661

(51) Int. Cl.
*G11C 11/00*  (2006.01)
(52) U.S. Cl.
USPC ........................... 365/148; 257/143; 438/104
(58) Field of Classification Search .................. 365/148; 257/143; 438/104
See application file for complete search history.

(56) References Cited

U.S. PATENT DOCUMENTS

| | | | |
|---|---|---|---|
| 6,204,139 B1 | 3/2001 | Liu et al. | |
| 7,242,469 B2 | 7/2007 | Wang et al. | |
| 7,369,431 B2 | 5/2008 | Muraoka et al. | |
| 7,384,792 B1 | 6/2008 | Wang et al. | |
| 7,428,046 B2 | 9/2008 | Wang et al. | |
| 7,433,222 B2 * | 10/2008 | Hosoi et al. | 365/148 |
| 7,460,224 B2 | 12/2008 | Wang et al. | |
| 7,663,132 B2 * | 2/2010 | Toda et al. | 257/3 |
| 7,826,247 B2 | 11/2010 | Muraoka et al. | |

(Continued)

FOREIGN PATENT DOCUMENTS

| | | |
|---|---|---|
| JP | 2004-363604 | 12/2004 |
| JP | 2007-004849 | 1/2007 |

(Continued)

*Primary Examiner* — Hoai V Ho
*Assistant Examiner* — Jay Radke
(74) *Attorney, Agent, or Firm* — Wenderoth, Lind & Ponack, LLP.

(57) ABSTRACT

Programming a variable resistance element includes: a writing step of applying a writing voltage pulse to transition metal oxide comprising two stacked metal oxide layers to decrease resistance of the metal oxide, each metal oxide layer having different oxygen deficiency; and an erasing step of applying an erasing voltage pulse, of different polarity than the writing pulse, to the metal oxide to increase resistance of the metal oxide. |Vw1|>|Vw2|, Vw1 representing voltage of the writing pulse for first to N-th writing steps, and Vw2 representing voltage of the writing pulse for (N+1)-th and subsequent writing steps, N being at least equal to 1, te1>te2, te1 representing pulse width of the erasing pulse for first to M-th erasing steps, and te2 representing pulse width of the erasing pulse for (M+1)-th and subsequent erasing steps. M>1. The (N+1)-th writing step follows the M-th erasing step.

20 Claims, 20 Drawing Sheets

U.S. PATENT DOCUMENTS

| | | | |
|---|---|---|---|
| 7,960,775 B2* | 6/2011 | Courtade et al. | 257/312 |
| 8,279,658 B2* | 10/2012 | Muraoka et al. | 365/148 |
| 2005/0206892 A1 | 9/2005 | Wang et al. | |
| 2007/0115714 A1 | 5/2007 | Muraoka et al. | |
| 2007/0153267 A1 | 7/2007 | Wang et al. | |
| 2007/0153269 A1 | 7/2007 | Wang et al. | |
| 2008/0002455 A1* | 1/2008 | Toda et al. | 365/148 |
| 2008/0219039 A1* | 9/2008 | Kumar et al. | 365/148 |
| 2008/0220601 A1* | 9/2008 | Kumar et al. | 438/585 |
| 2008/0259678 A1 | 10/2008 | Muraoka et al. | |
| 2008/0278990 A1* | 11/2008 | Kumar et al. | 365/148 |
| 2009/0152526 A1* | 6/2009 | Courtade et al. | 257/4 |
| 2009/0283736 A1 | 11/2009 | Kanzawa et al. | |
| 2009/0290407 A1* | 11/2009 | Mouli | 365/158 |
| 2010/0271860 A1 | 10/2010 | Muraoka et al. | |
| 2011/0194336 A1* | 8/2011 | Mouli | 365/158 |

FOREIGN PATENT DOCUMENTS

| | | |
|---|---|---|
| JP | 2007-004873 | 1/2007 |
| JP | 2007-134512 | 5/2007 |
| JP | 2007-188559 | 7/2007 |
| WO | 2005/059921 | 6/2005 |
| WO | 2008/149484 | 12/2008 |
| WO | 2009/145308 | 12/2009 |
| WO | 2010/038442 | 4/2010 |

* cited by examiner (*) $\begin{cases} \text{Second writing step (Vw2} = -2.0 \text{ V/100 ns, } |\text{Vw1}| > |\text{Vw2}|) \\ \text{Second erasing step (Ve2} = +2.5 \text{ V/100 ns, } |\text{Ve1}| > |\text{Ve2}|) \end{cases}$ Composition of first tantalum oxide layer 3a     TaOx (x = 1.54)
Composition of second tantalum oxide layer 3b    TaOy (y = 2.47)
Thickness of variable resistance layer 3         30 nm
Thickness of first tantalum oxide layer 3a       22 nm
Thickness of second tantalum oxide layer 3b      8 nm Composition of first tantalum oxide layer 3a   TaOx (x = 1.54)
Composition of second tantalum oxide layer 3b  TaOy (y = 2.47)
Thickness of variable resistance layer 3       50 nm
Thickness of first tantalum oxide layer 3a     45 nm
Thickness of second tantalum oxide layer 3b    5 nm First writing voltage Vw1 = Second writing voltage Vw2 = -2.0 V / 100 ns
First erasing voltage Ve1 = Second erasing voltage Ve2 = +2.5 V / 100 ns First writing voltage Vw1 = Second writing voltage Vw2 = -3.0 V / 100 ns
First erasing voltage Ve1 = Second erasing voltage Ve2 = +4.0 V / 100 ns tw1 = 1 ms, te1 = 100 ns tw1 = 1 ms, te1 = 1 ms

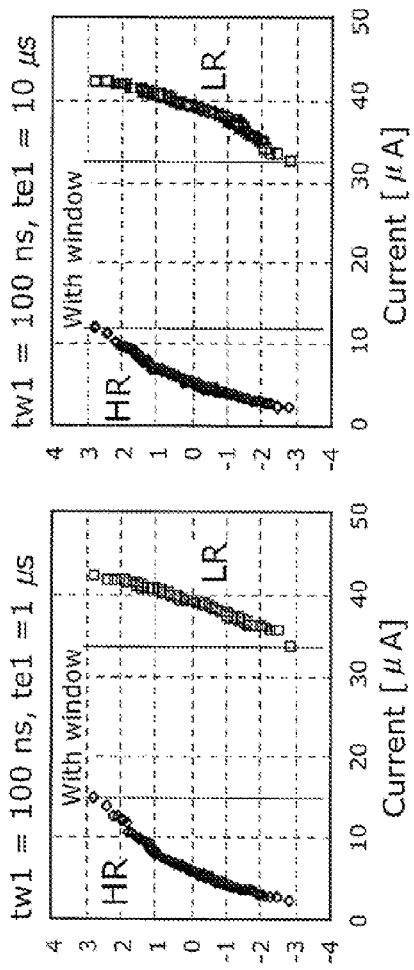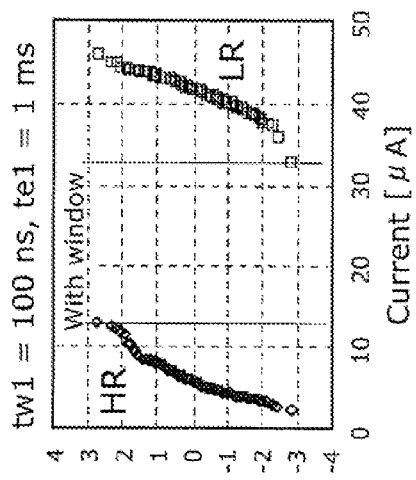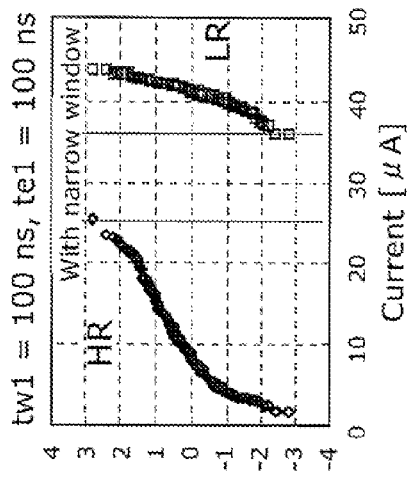

Vw1 = −3.0 V  tw1 = 100 ns
Ve1 = +2.5 V  te1 = 100 ns to 1 ms
Vw2 = −2.0 V  tw2 = 100 ns
Ve2 = +2.5 V  te2 = 100 ns

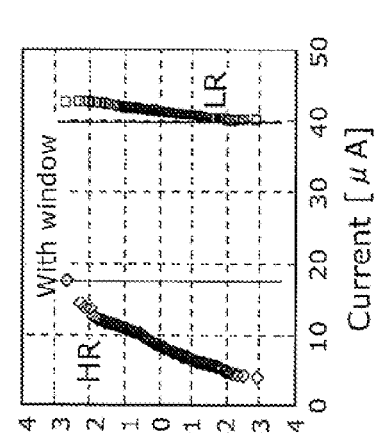
FIG. 18A / FIG. 18B / FIG. 18C
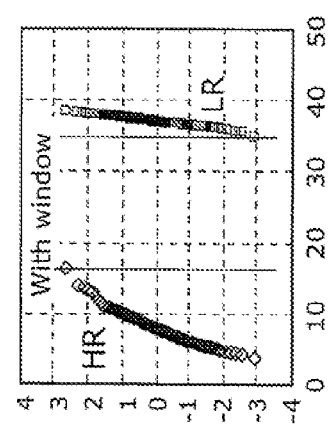
FIG. 18D

METHOD OF PROGRAMMING VARIABLE RESISTANCE ELEMENT, METHOD OF INITIALIZING VARIABLE RESISTANCE ELEMENT, AND NONVOLATILE STORAGE DEVICE

TECHNICAL FIELD

The present invention relates to a method of programming a variable resistance element in which resistance values change based on applied electric pulses, a method of initializing the variable resistance element, and a nonvolatile memory device that performs the methods.

BACKGROUND ART

With the development in digital technologies for electronic devices in recent years, demands for a nonvolatile variable resistance element which has a greater capacity, higher writing and reading speed, and longer-life and which consumes lower power in writing have been increased, for storing data such as images. To meet such demands, efforts of miniaturizing flash memories using existing floating gates are said to have limitations.

A nonvolatile variable resistance element using perovskite material ($Pr_{(1-x)}Ca_xMnO_3$ [PCMO], $LaSrMnO_3$ [LSMO], and $GdBaCo_xO_y$ [GBCO], for example) has been proposed as a first conventional technique that could possibly meet the above demands (refer to PTL 1). With this technique, voltage pulses (a short-duration waveform voltage) having different polarities are applied to the perovskite material to increase or decrease resistance values and the resistance values that change are associated with data, thereby storing the data.

There is also a nonvolatile variable resistance element which utilizes the characteristics of a film of transition metal oxide (NiO, $V_2O$, ZnO, $Nb_2O_5$, $TiO_2$, $WO_3$, or CoO), that is, resistance values change when voltage pulses having different pulse widths are applied to the film of the transition metal oxide, as a second conventional technique that enables switching the resistance values using a homopolarity voltage pulse (refer to PTL 2). In another implemented configuration of the variable resistance element using a transition metal oxide film, cross-point type memory arrays using a diode are stacked.

CITATION LIST

Patent Literature

[PTL 1]
U.S. Pat. No. 6,204,139
[PTL 2]
Japanese Unexamined Patent Application Publication No. 2004-363604

SUMMARY OF INVENTION

Technical Problem

However, problems such as insufficient operation stability and reproducibility have been found in the first conventional technique. In addition, there is another problem that, since oxide crystal having a perovskite structure such as $Pr_{0.7}Ca_{0.3}MnO_3$ generally needs the high temperature of 650 degrees Celsius to 850 degrees Celsius for crystallization, introduction of the oxide crystal to semiconductor manufacturing processing deteriorates other materials.

Moreover, the second conventional technique describes initial pulse application conditions necessary for variable resistance operation, but fails to mention stabilization of data at the time of repeated operation of rewriting data plural times (endurance operation).

The present invention has been conceived in view of the above circumstances, and has a primary object to provide a method of programming a variable resistance element that can be manufactured at low temperature, that is, a method of programming a variable resistance element which enables the variable resistance element to stably perform a resistance change, and a nonvolatile memory device that performs the methods.

Solution to Problem

In order to solve the above problems, a method of programming a variable resistance element according to one aspect of the present invention is a method of programming a variable resistance element which includes a transition metal oxide having resistance values that increase and decrease according to applied electric pulses, the transition metal oxide comprising a first transition metal oxide layer and a second transition metal oxide layer which are stacked, the second transition metal oxide layer having a degree of oxygen deficiency smaller than a degree of oxygen deficiency of the first transition metal oxide layer, the method including: performing at least one writing step by applying a writing voltage pulse having a first polarity to the transition metal oxide so as to change a resistance state of the transition metal oxide from high to low; and performing at least one erasing step by applying an erasing voltage pulse having a second polarity to the transition metal oxide so as to change the resistance state of the transition metal oxide from low to high, the second polarity being different from the first polarity, wherein |Vw1|>|Vw2| is satisfied, where Vw1 represents a voltage value of the writing voltage pulse for first to N-th writing steps, and Vw2 represents a voltage value of the writing voltage pulse for (N+1)-th and subsequent writing steps, where N is equal to or more than 1, te1>te2 is satisfied, where te1 represents a pulse width of the erasing voltage pulse for first to M-th erasing steps, and te2 represents a pulse width of the erasing voltage pulse for (M+1)-th and subsequent erasing steps, where M is equal to or more than 1, and the (N+1)-th writing step follows the M-th erasing step.

Furthermore, in the method of programming a variable resistance element according to the one aspect of the present invention, |Ve1|>|Ve2| may be further satisfied, where Ve1 represents a voltage value of the erasing voltage pulse for the first to M-th erasing steps, and Ve2 represents a voltage value of the erasing voltage pulse for the (M+1)-th and subsequent erasing steps.

Moreover, in the method of programming a variable resistance element according to the one aspect of the present invention, tw1<te1 may be further satisfied, where tw1 represents a pulse width of the writing voltage pulse for the first to N-th writing steps.

Furthermore, in the method of programming a variable resistance element according to the one aspect of the present invention, it is preferred that te2×10≦te1 are further satisfied.

Moreover, in the method of programming a variable resistance element according to the one aspect of the present invention, it is preferred that |Ve1|≧|Vw1| and |Ve2|≧|Vw2| are further satisfied.

Furthermore, in the method of programming a variable resistance element according to the one aspect of the present invention, it is preferred that the second transition metal oxide layer has a resistance value larger than a resistance value of the first transition metal oxide layer.

Moreover, in the method of programming a variable resistance element according to the one aspect of the present invention, it is preferred that a first transition metal comprising the first transition metal oxide layer is different from a second transition metal comprising the second transition metal oxide layer, and the second transition metal has a standard electrode potential lower than a standard electrode potential of the first transition metal.

Furthermore, in the method of programming a variable resistance element according to the one aspect of the present invention, it is preferred that the first transition metal oxide layer comprises a tantalum oxide having a composition represented by $TaO_x$, where $0.8 \leq x \leq 1.9$, and the second transition metal oxide layer comprises a tantalum oxide having a composition represented by $TaO_y$, where $2.1 \leq y < 2.5$.

A nonvolatile memory device according to an other aspect of the present invention including: a first electrode; a second electrode; a variable resistance element which is provided between the first electrode and the second electrode, and includes a transition metal oxide having resistance values that increase and decrease according to electric pulses applied between the first and the second electrodes; and a drive unit, wherein the transition metal oxide comprises a first transition metal oxide layer and a second transition metal oxide layer which are stacked, the second transition metal oxide layer having a degree of oxygen deficiency smaller than a degree of oxygen deficiency of the first transition metal oxide layer, the drive unit is configured to perform: a writing step by applying a writing voltage pulse having a first polarity between the first electrode and the second electrode so as to change a resistance state of the transition metal oxide from high to low; and an erasing step by applying an erasing voltage pulse having a second polarity between the first electrode and the second electrode so as to change the resistance state of the transition metal oxide from low to high, the second polarity being different from the first polarity, $|Vw1|>|Vw2|$ is satisfied, where Vw1 represents a voltage value of the writing voltage pulse for first to N-th writing steps, and Vw2 represents a voltage value of the writing voltage pulse for (N+1)-th and subsequent writing steps, where N is equal to or more than 1, te1>te2 is satisfied, where te1 represents a pulse width of the erasing voltage pulse for first to M-th erasing steps, and te2 represents a pulse width of the erasing voltage pulse for (M+1)-th and subsequent erasing steps, where M is equal to or more than 1, and the (N+1)-th writing step follows the M-th erasing step.

Furthermore, in the nonvolatile memory device according to the other aspect of the present invention, $|Ve1|>|Ve2|$ may be further satisfied, where Ve1 represents a voltage value of the erasing voltage pulse for the first to M-th erasing steps, and Ve2 represents a voltage value of the erasing voltage pulse for the (M+1)-th and subsequent erasing steps.

Moreover, in the nonvolatile memory device according to the other aspect of the present invention, tw1<te1 may be further satisfied, where tw1 represents a pulse width of the writing voltage pulse for the first to N-th writing steps.

Furthermore, in the nonvolatile memory device according to the other aspect of the present invention, it is preferred that $te2 \times 10 \leq te1$ are further satisfied.

Moreover, in the nonvolatile memory device according to the other aspect of the present invention, it is preferred that $|Ve1| \geq |Vw1|$ and $|Ve2| \geq |Vw2|$ are further satisfied.

Furthermore, in the nonvolatile memory device according to the other aspect of the present invention, it is preferred that the second transition metal oxide layer has a resistance value larger than a resistance value of the first transition metal oxide layer.

Moreover, in the nonvolatile memory device according to the other aspect of the present invention, it is preferred that a first transition metal comprising the first transition metal oxide layer is different from a second transition metal comprising the second transition metal oxide layer, and the second transition metal has a standard electrode potential lower than a standard electrode potential of the first transition metal.

Furthermore, in the nonvolatile memory device according to the other aspect of the present invention, it is preferred that the first transition metal oxide layer comprises a tantalum oxide having a composition represented by $TaOx$, where $0.8 \leq x \leq 1.9$, and the second transition metal oxide layer comprises a tantalum oxide having a composition represented by $TaOy$, where $2.1 \leq y < 2.5$.

Moreover, it is preferred that the nonvolatile memory device according to the other aspect of the present invention further includes a current steering element electrically connected to one of the first electrode and the second electrode. The current steering element may be a selection transistor or a diode.

A method of initializing a variable resistance element according to another aspect of the present invention is a method of initializing a variable resistance element which includes a transition metal oxide having resistance values that increase and decrease according to applied electric pulses, wherein the transition metal oxide comprises a first transition metal oxide layer and a second transition metal oxide layer which are stacked, the second transition metal oxide layer having a degree of oxygen deficiency smaller than a degree of oxygen deficiency of the first transition metal oxide layer, in the case where data is written to and erased from the variable resistance element, by repeating in sequence: a writing step by applying, to the transition metal oxide, a writing voltage pulse having a first polarity and a voltage value Vw2 so as to change a resistance state of the transition metal oxide from high to low; and an erasing step by applying, to the transition metal oxide, an erasing voltage pulse having a second polarity and a pulse width te2 so as to change the resistance state of the transition metal oxide from low to high, the second polarity being different from the first polarity, the method including: performing at least one initial writing step by applying, to the transition metal oxide, a voltage pulse having the first polarity and a voltage value Vw1 satisfying $|Vw1|>|Vw2|$ so as to change a resistance state of the transition metal oxide from high to low; and subsequently performing at least one initial erasing step by applying, to the transition metal oxide, an erasing voltage pulse having a second polarity and a pulse width te1 satisfying te1>te2 so as to change the resistance state of the transition metal oxide from low to high, wherein a next first writing step follows a last initial erasing step.

Advantageous Effects of Invention

The method of programming a variable resistance element according to the present invention enables the variable resistance element to stably perform a resistance change. Moreover, the nonvolatile memory device according to the present invention which performs the method of programming makes it possible to realize a storage device that is stably operable.

BRIEF DESCRIPTION OF DRAWINGS

FIG. 16A is a diagram illustrating an example of a distribution of resistance values.

FIG. 16B is a diagram illustrating an example of a distribution of resistance values.

FIG. 16C is a diagram illustrating an example of a distribution of resistance values.

FIG. 16D is a diagram illustrating an example of a distribution of resistance values.

FIG. 16E is a diagram illustrating an example of a distribution of resistance values.

FIG. 18A is a diagram illustrating an example of a distribution of resistance values.

FIG. 18B is a diagram illustrating an example of a distribution of resistance values.

FIG. 18C is a diagram illustrating an example of a distribution of resistance values.

FIG. 18D is a diagram illustrating an example of a distribution of resistance values.

DESCRIPTION OF EMBODIMENTS

The following describes preferred embodiments of the present invention with reference to the drawings.

Embodiment 1

(Configuration of Variable Resistance Element)

First, a configuration of a variable resistance element according to Embodiment 1 is described.

Figure 1:
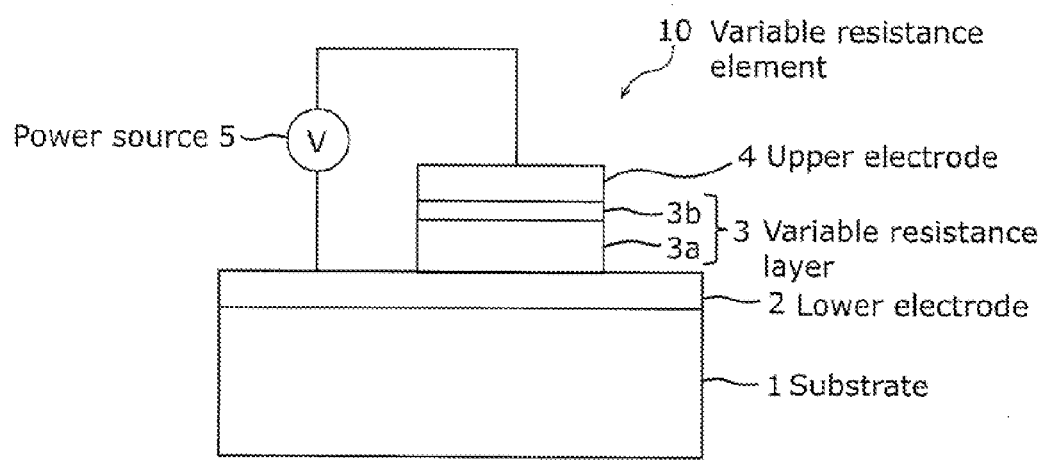
FIG. 1 is a schematic diagram showing an example of a configuration of a variable resistance element according to Embodiment 1 of the present invention.

FIG. 1 is a schematic diagram showing an example of the configuration of the variable resistance element according to Embodiment 1 of the present invention. As shown in FIG. 1, the variable resistance element 10 according to this embodiment includes a substrate 1, a lower electrode 2 formed on the substrate 1, a variable resistance layer 3 formed on the lower electrode 2, and an upper electrode 4 formed on the variable resistance layer 3. Each of the lower electrode 2 and the upper electrode 4 is electrically connected to the variable resistance layer 3.

The substrate 1 comprises a silicon substrate, for example. Each of the lower electrode 2 and the upper electrode 4 comprises at least one of materials among gold (Au), platinum (Pt), iridium (Ir), and copper (Cu).

The variable resistance layer 3 includes a first transition metal oxide layer 3a and a second transition metal oxide layer 3b which are stacked. In this embodiment, as an example, the first tantalum oxide layer 3a and the second tantalum oxide layer 3b are stacked. Here, an oxygen content percentage of the second tantalum oxide layer 3b is higher than that of the first tantalum oxide layer 3a. Stated differently, a degree of oxygen deficiency of the second tantalum oxide layer 3b is smaller than that of the first tantalum oxide layer 3a. The degree of oxygen deficiency refers to a ratio of deficient oxygen to oxygen included in each of transition metal oxides having a stoichiometric composition. For instance, when a transition metal is tantalum (Ta), the stoichiometric composition of an oxide is $Ta_2O_5$, and thus can be represented by $TaO_{2.5}$. The degree of oxygen deficiency of $TaO_{2.5}$ is 0%. For example, the degree of oxygen deficiency of an oxygen deficient tantalum oxide having a composition $TaO_{1.5}$ can be calculated as degree of oxygen deficiency=(2.5−1.5)/2.5=40%. The oxygen content percentage of $Ta_2O_5$ is calculated as a ratio of oxygen atoms to the number of all the atoms (i.e. O/(Ta+O)), that is, 71.4%. Thus, the oxygen content percentage of the oxygen deficient tantalum oxide is greater than 0% and less than 71.4%.

When a composition of the first tantalum oxide layer 3a is $TaO_x$, x is within a range from 0.8 to 1.9, and when a composition of the second tantalum oxide layer 3b is $TaO_y$, y is within a range from 2.1 to 2.5. In these cases, it was possible to stably change the resistance value of the variable resistance layer 3. Therefore, it is preferable that x and y are within the above respective ranges.

Although the resistance value is changed if a thickness of the variable resistance layer 3 is 1 μm or less, the thickness is preferably equal to or less than 200 nm. This is because the thickness of 200 nm or less can facilitate manufacturing if lithography is used as a patterning process, and can lower a voltage value of a voltage pulse necessary to change the resistance value of the variable resistance layer 3. On the other hand, in order to surely prevent a breakdown (insulation breakdown) in application of voltage pulses, the thickness of the variable resistance layer 3 is preferably at least 5 nm or more.

Regarding a thickness of the second tantalum oxide layer 3b, if the thickness is too large, there are drawbacks such as too high initial resistance value, and if too small, there are drawbacks of unstable resistance change, for example. Therefore, the thickness of the second tantalum oxide layer 3b is preferably within a range approximately from 1 nm to 8 nm.

When the variable resistance element 10 having the above-described configuration is to be operated, the lower electrode 2 and the upper electrode 4 are electrically connected to respective different terminals of a power source 5. The power source 5, which serves as an electric pulse applying device that drives the variable resistance element 10, has a configuration for applying electric pulses (voltage pulses) having predetermined polarities, voltages, and time widths between the lower electrode 2 and the upper electrode 4.

It is assumed in the following description that a voltage of a voltage pulse applied between the electrodes is determined by a potential of the upper electrode 4 with reference to the lower electrode 2.

(Manufacturing Method of Variable Resistance Element)

Next, a method of manufacturing the variable resistance element 10 is described.

First, the lower electrode 2 having the thickness of 0.2 μm is formed on the substrate 1 by a sputtering method. Then, using a so-called reactive sputtering method for spattering a Ta target in argon gas and oxygen gas, a tantalum oxide layer is formed on the lower electrode 2. Here, an oxygen content percentage of the tantalum oxide layer can be easily adjusted by changing a ratio between a flow rate of the oxygen gas and a flow rate of the argon gas. The temperature of the substrate can be set as an ambient temperature, and heating is not necessary.

Next, a top surface of the tantalum oxide layer formed in the above manner is oxidized to be improved. Thus, on the surface of the tantalum oxide layer has a range (second range) having an oxygen content percentage that is higher than that of the other range (first range) in which the oxidization is not applied. The first range corresponds to the first tantalum oxide layer 3a and the second range corresponds to the second tantalum oxide layer 3b. The first tantalum oxide layer 3a and the second tantalum oxide layer 3b which are thus manufactured form the variable resistance layer 3.

Next, on the variable resistance layer 3 thus formed, the upper electrode 4 having the thickness of 0.2 μm is formed by a sputtering method. As a result, the variable resistance element 10 is manufactured.

Here, a size and a shape of each of the lower electrode 2, the upper electrode 4, and the variable resistance layer 3 can be adjusted by a mask and a lithography. In this embodiment, a size of each of the upper electrode 4 and the variable resistance layer 3 is set to 0.5 μm×0.5 μm (an area of 0.25 μm$^2$), and a size of a part where the lower electrode 2 contacts the variable resistance layer 3 is set to the same 0.5 μm×0.5 μm (an area of 0.25 μm$^2$).

Further, in this embodiment, the first tantalum oxide layer 3a has a composition represented by $TaO_x$ (where x=1.54) and the second tantalum oxide layer 3b has a composition represented by $TaO_y$ (where y=2.47). Analysis on compositions of the oxide layers in the embodiments of the present invention always employs Rutherford Backscattering Spectrometry (RBS). Furthermore, a thickness of the variable resistance layer 3 is set to 30 nm, a thickness of the first tantalum oxide layer 3a is set to 22 nm, and a thickness of the second tantalum oxide layer 3b is set to 8 nm.

It should be noted that the description of this embodiment is given, assuming x=1.54 and y=2.47, but the present invention is not limited to this. If $0.8 \leq x \leq 1.9$ and $2.1 \leq y < 2.5$, stable resistance change can be achieved like the variable resistance characteristics in this embodiment.

(Operation of Variable Resistance Element)

The following describes operation of the variable resistance element 10 manufactured through the above-described manufacturing method.

In the following description, a high resistance state refers to a situation where a resistance value of the variable resistance layer 3 is high (for example, 20000Ω), and a low resistance state refers to a situation where the resistance value is low (for example, 700Ω).

When a writing voltage pulse that is a voltage pulse having a negative polarity (i.e., causing the upper electrode 4 to have a negative voltage with reference to the lower electrode 2) and has amplitude larger than amplitude of a write threshold voltage is applied between the lower electrode 2 and the upper electrode 4 using the power source 5, the resistance value of the variable resistance layer 3 is decreased, and thus the variable resistance layer 3 is changed from a high resistance state to a low resistance state. This is called a writing step in the following description.

On the other hand, when an erasing voltage pulse that is a voltage pulse having a positive polarity (i.e., causing the upper electrode 4 to have a positive voltage with reference to the lower electrode 2) and has amplitude larger than amplitude of a erasing threshold voltage is applied between the lower electrode 2 and the upper electrode 4 using the power source 5, the resistance value of the variable resistance layer 3 is increased, and thus the state of the variable resistance layer 3 is changed from a low resistance state to a high resistance state. This is called an erasing step in the following description.

Here, even if a voltage pulse having a negative polarity that is the same polarity of the writing voltage pulse is applied between the lower electrode 2 and the upper electrode 4 when the variable resistance layer 3 is in a low resistance state, the variable resistance layer 3 remains in the low resistance state. Likewise, even if a voltage pulse having a positive polarity that is the same polarity of the erasing voltage pulse is applied between the lower electrode 2 and the upper electrode 4 when the variable resistance layer 3 is in a high resistance state, the variable resistance layer 3 remains in the high resistance state.

By executing a writing step and an erasing step alternately, the variable resistance element 10 is operated. Here, so-called overwriting, which is successive execution of writing steps or successive execution of erasing steps, may be performed.

In this embodiment, $|Vw1|>|Vw2|$, where Vw1 represents a voltage value of a writing voltage pulse (hereinafter, referred to as a "first writing voltage pulse") in writing steps (hereinafter, referred to as "first writing steps") from the first writing step immediately after the manufacture of the variable resistance element 10 to the N-th writing step (where N is equal to or more than 1), and Vw2 represents a voltage value of a writing voltage pulse (hereinafter, referred to as a "second writing voltage pulse") in writing steps (hereinafter, referred to as "second writing steps") subsequent to the (N+1)-th writing step.

In addition, $|Ve1|>|Ve2|$, where Ve1 represents a voltage value of an erasing voltage pulse (hereinafter, referred to as a "first erasing voltage pulse") in erasing steps (hereinafter, referred to as "first erasing steps") from the first erasing step immediately after the manufacture of the variable resistance element 10 to the M-th erasing step (where M is equal to or more than 1), and Ve2 represents a voltage value of an erasing voltage pulse (hereinafter, referred to as a "second erasing voltage pulse") in erasing steps (hereinafter, referred to as "second erasing steps") subsequent to the (M+1)-th erasing step.

Here, when overwriting is executed from the first writing, that is, when a plurality of the first writing steps are performed successively, N in the above conditions is equal to or more than 2. Likewise, when a plurality of the first erasing steps are performed successively, M in the above conditions is equal to or more than 2.

Moreover, when a first writing step and a first erasing step are alternately executed plural times, which is different from the above overwriting, each of N and M is equal to or more than 2.

Although each of N and M is equal to or more than 2 as described above, a second writing step should follow a first erasing step whatever N and M are. In other words, it is necessary that there is a first erasing step between a first writing step and a second writing step, thereby preventing that the first writing step and the second writing step are executed successively. If the second writing step does not follow the first erasing step and the second writing step follows the first writing step, it is difficult to achieve stable resistance change.

Figure 2:
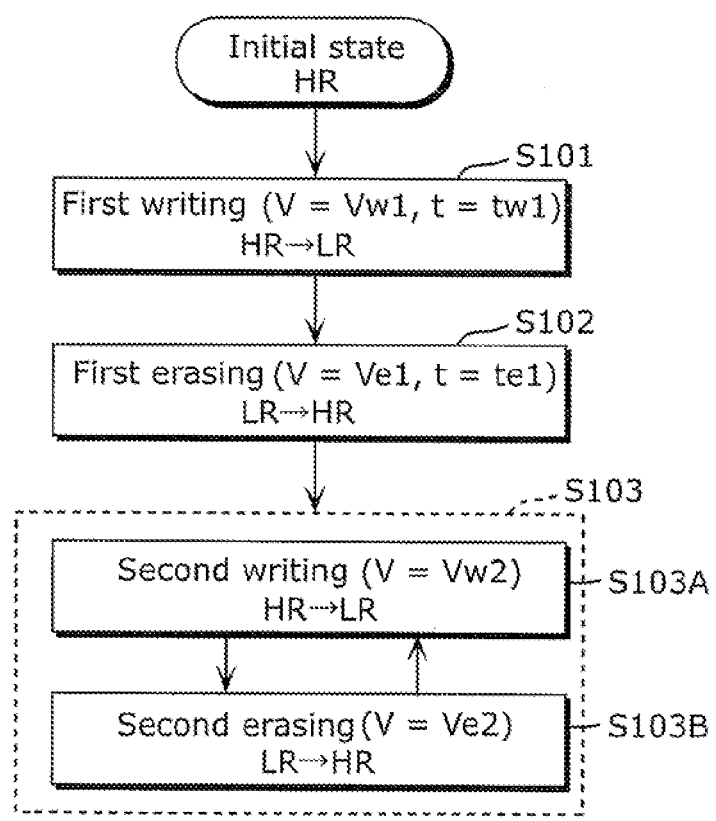
FIG. 2 is a flowchart showing a procedure for a method of programming a variable resistance element according to Embodiment 1 of the present invention.

The above-described method of programming the variable resistance element 10 according to Embodiment 1 of the present invention is presented by a flowchart of FIG. 2. First, a first writing step is executed by applying a voltage pulse having a voltage value Vw1 (S101). Thus, the state of the variable resistance layer 3 is changed from an initial high resistance state (HR) to a low resistance state (LR). Next, a first erasing step is executed by applying a voltage pulse having a voltage value Ve1 (S102). Thus, the state of the variable resistance layer 3 is changed from the low resistance state to a high resistance state.

After that, Step 103 for repeating a pair of a second writing step and a second erasing step is executed. More specifically, a second writing step using a voltage pulse having a voltage value Vw2 (S103A) and a second erasing step using a voltage pulse having a voltage value Ve2 (S103B) are repeated alternately. The execution of Step S103A changes the state of the variable resistance layer 3 from a high resistance state to a low resistance state, while the execution of Step S103B changes the state of the variable resistance layer 3 from a low resistance state to a high resistance state.

As described above, if at least one of N and M in the conditions is equal to or more than 2, at least one of Steps S101 and S102 is repeated.

The present invention does not limit any details for implementing the steps in the flowchart of FIG. 2. For instance, Steps S101 and S102 may be performed before shipment of a manufactured variable resistance element, as initialization for the variable resistance element. And, Step S103 may be performed when a user actually uses the variable resistance element (namely, writes or erases data).

As described in more detail later, execution of Steps S101 and S102 for a variable resistance element having an initial resistance state after manufacturing can provide the variable resistance element with stable high-speed operation and good endurance characteristics. Therefore, Steps S101 and S102 are executed for a variable resistance element before its shipment in order to confirm a desired change in its resistance state. Thus, it is possible to perform, at once, the examination for production quality and the improvement of operation characteristics.

Figure 3:
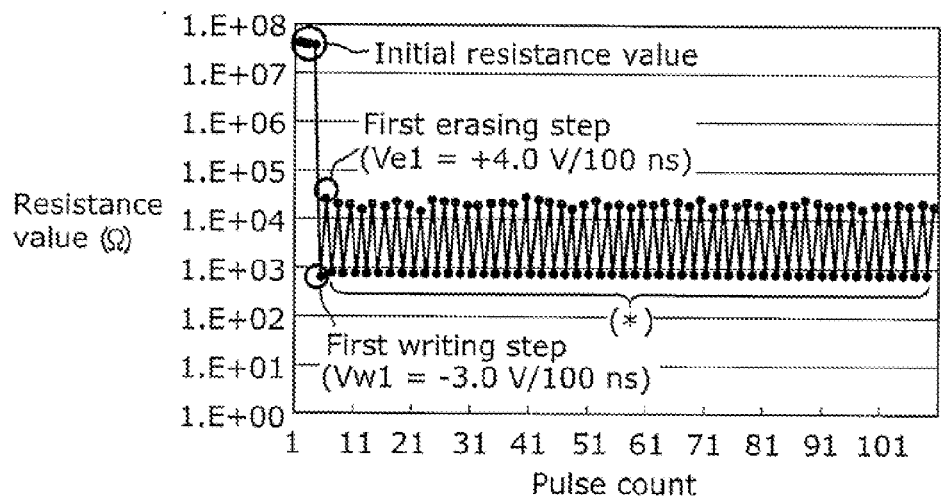
FIG. 3 is a graph showing an example of variation of a resistance state of a variable resistance layer.

FIG. 3 is a graph showing an example of variation of a resistance state of the variable resistance layer 3. In this example, a voltage value Vw1 of the first writing voltage pulse is assumed to be −3.0 V, and a voltage value Vw2 of the second writing voltage pulse is assumed to be −2.0 V. In addition, a voltage value Ve1 of the first erasing voltage pulse is assumed to be +4.0 V, and a voltage value Ve2 of the second erasing voltage pulse is assumed to be +2.5 V. Here, in any cases, a pulse width is assumed to be 100 ns. It is also assumed in the graph that a first writing step and a first erasing step are respectively executed once.

FIG. 3 shows stable variation of the resistance state of the variable resistance layer 3. As shown in FIG. 3, application of voltage pulses satisfying $|Vw1|>|Vw2|$ and $|Ve1|>|Ve2|$ between the two electrodes allows the variable resistance element 10 to be operated stably. This embodiment satisfies also the conditions of Well $|Ve1| \geq |Vw1|$ and $|Ve2| \geq |Vw2|$, which is considered as one of causes of the stable operation of the variable resistance element 10.

The following describes the situation where the variable resistance element 10 is implemented as a memory, to and from which data having one bit is written and read out. In the following case, "1" represents a low resistance state of the variable resistance layer 3, and "0" represents a high resistance state of the variable resistance layer 3.

Figure 4:
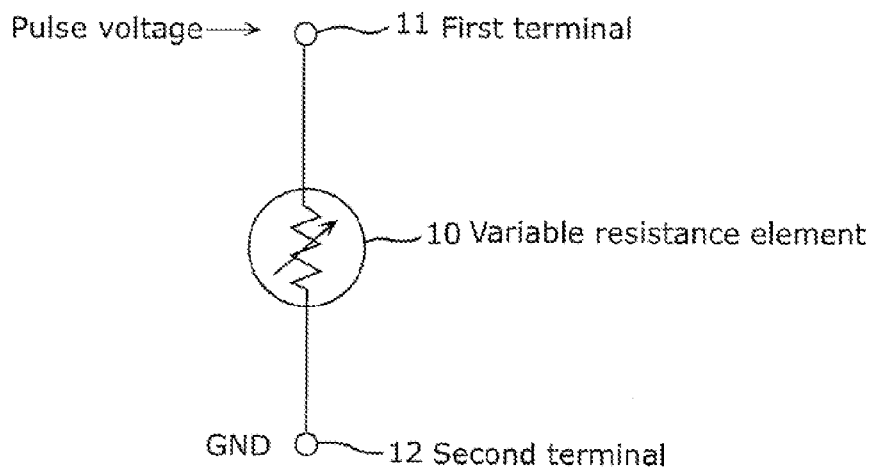
FIG. 4 is a diagram showing an example of a configuration of a circuit operating the variable resistance element and an operation example of the case where data is written into the variable resistance element according to Embodiment 1 of the present invention.

FIG. 4 is a diagram showing an example of a configuration of a circuit operating the variable resistance element 10 according to Embodiment 1 of the present invention and an operation example of the case where data is written into the variable resistance element 10. As shown in FIG. 4, the circuit includes the variable resistance element 10, a first terminal 11, and a second terminal 12. The upper electrode 4 of the variable resistance element 10 is electrically connected to the first terminal 11, and the lower electrode 2 of the variable resistance element 10 is electrically connected to the second terminal 12.

Figure 5:
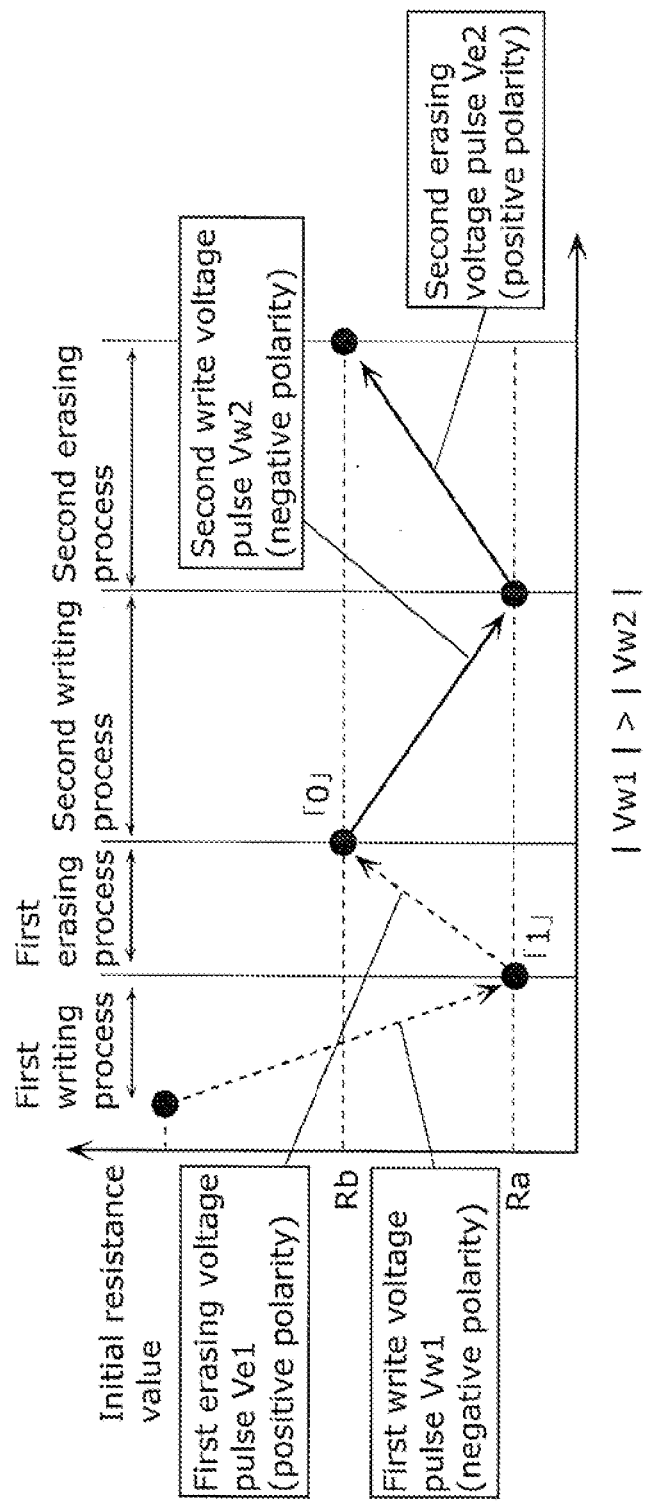
FIG. 5 is a diagram showing variation of resistance values of a variable resistance layer in the case of writing and erasing data to and from the variable resistance element according to Embodiment 1 of the present invention.

FIG. 5 is a graph showing variation of resistance values of the variable resistance layer 3 in the case where data is written into (writing step) and erased from (erasing step) the variable resistance element 10 according to Embodiment 1 of the present invention. In the writing step and the erasing step, as shown in FIG. 4, the second terminal 12 is grounded (GND) and a voltage pulse is provided to the first terminal 11. The voltage pulse is determined with reference to the lower electrode 2 and a ground point.

When the variable resistance element 10 is in an initial state (in other words, a resistance value of the variable resistance layer 3 is an initial resistance value), a first writing voltage pulse having a negative polarity (voltage value Vw1) is provided to the first terminal 11. Thus, as shown in FIG. 5, a resistance value of the variable resistance layer 3 is decreased from the initial resistance value and the variable resistance layer 3 gets in a low resistance state Ra. As a result, one bit data indicating "1" is written into the variable resistance element 10. Next, when a first erasing voltage pulse having a positive polarity (voltage value Ve1) is provided to the first terminal 11, the state of the variable resistance layer 3 is changed from the low resistance state Ra to a high resistance state Rb. As a result, one bit data indicating "0" is written into the variable resistance element 10.

Then, if, in the high resistance state Rb of the variable resistance layer 3, a second writing voltage pulse having a negative polarity (voltage value Vw2) is provided to the first terminal 11, the high resistance state Rb of the variable resistance layer 3 is changed to the low resistance state Ra. On the other hand, if, in the low resistance state Ra of the variable resistance layer 3, a second erasing voltage pulse having a positive polarity (voltage value Ve2) is provided to the first terminal 11, the low resistance state Ra of the variable resistance layer 3 is changed to the high resistance state Rb.

In the circuit, when a voltage pulse satisfying |Vw1|>|Vw2| and |Ve1|>|Ve2| as described above is supplied to the first terminal 11, the variable resistance element 10 can serve as a memory which operates stably.

Figure 6:
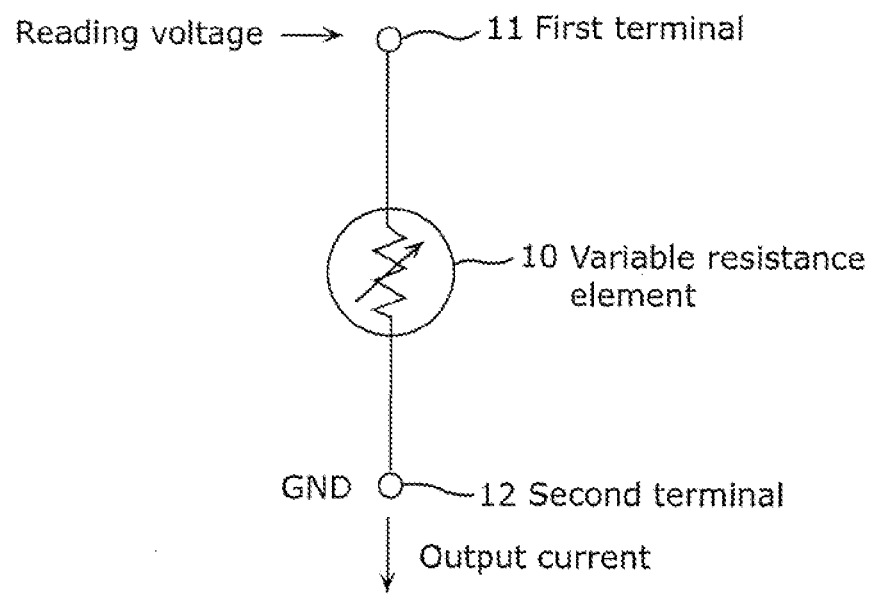
FIG. 6 is a diagram showing an example of a configuration of a circuit operating the variable resistance element and an operation example of the case where data written into the variable resistance element is read out according to Embodiment 1 of the present invention.

FIG. 6 is a diagram showing an example of a configuration of a circuit operating the variable resistance element 10 according to the first embodiment of the present invention and an operation example of the case where data is read out from the variable resistance element 10. As shown in FIG. 6, when data is to be read out, the second terminal 12 is grounded (GND), and a readout voltage is provided to the first terminal 11. The readout voltage is determined with reference to the lower electrode 2 and a ground point. The readout voltage is usually set to a voltage having amplitude less than the amplitude of the write threshold voltage and the erasing threshold voltage so that the written data is not rewritten.

Figure 7:
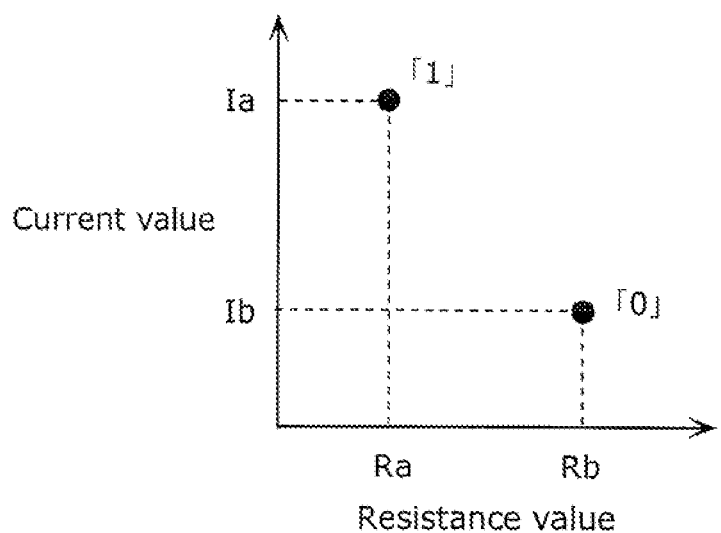
FIG. 7 is a diagram showing a relationship between a current value of a current flowing, at the time of reading out data, into a circuit including the variable resistance element and a resistance value of a variable resistance layer according to Embodiment 1 of the present invention.

FIG. 7 is a graph showing a relationship between (a) a current value of current flowing in a circuit having the variable resistance element 10 according to the first embodiment of the present invention and (b) a resistance value of the variable resistance layer 3, when data is read out. When a readout voltage is provided to the first terminal 11, current depending on the resistance value of the variable resistance layer 3 flows in the circuit. More specifically, as shown in FIG. 7, when the variable resistance layer 3 is in the low resistance state Ra, current having a current value Ia flows in the circuit, while, when the variable resistance layer 3 is in the high resistance state Rb, current having a current value Ib flows in the circuit.

When the second terminal 12 is grounded as shown in FIG. 6 and a readout voltage of +0.4 V, for example, is provided to the first terminal 11, a current value of the current flowing between the first terminal 11 and the second terminal 12 is detected to determine whether the variable resistance layer 3 is in the high resistance state or in the low resistance state. More specifically, if the detected current value is Ia, it is determined that the variable resistance layer 3 is in the low resistance state Ra. As a result, it is learned that data written into the variable resistance element 10 is "1". On the other hand, if the detected current value is Ib, it is determined that the variable resistance layer 3 is in the high resistance state Rb. As a result, it is learned that data written into the variable resistance element 10 is "0". As described above, the data is read out from the variable resistance element 10.

A resistance value of the variable resistance element 10 according to this embodiment is not changed even if the variable resistance element 10 is powered off. Therefore, the variable resistance element 10 can be implemented as a nonvolatile storage device.

Figure 8A:
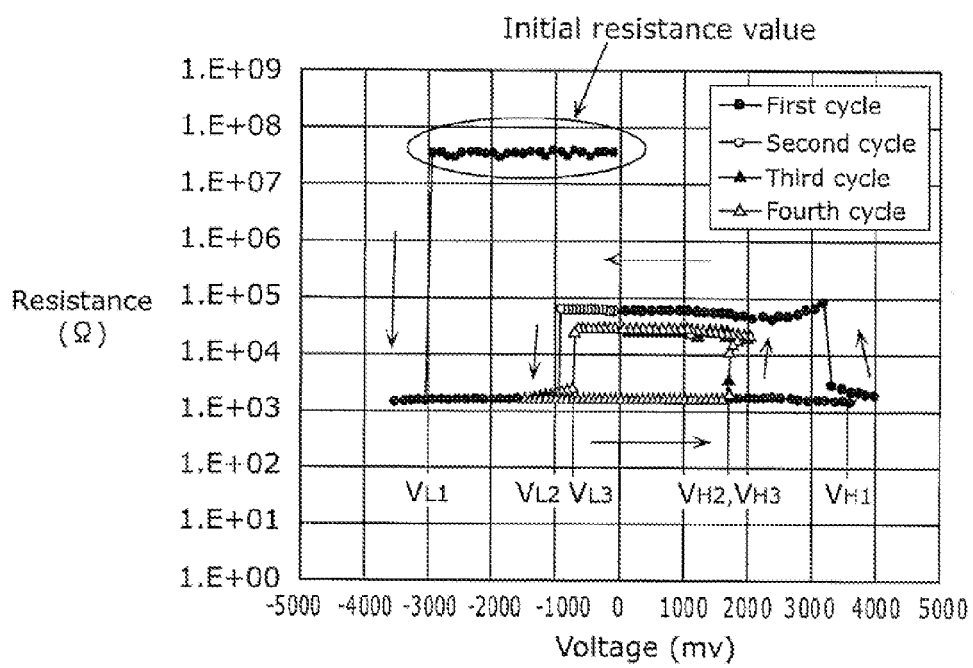
FIG. 8A is a graph showing hysteresis characteristics of variation of resistance values of a variable resistance layer 3 in the case where the variable resistance element is applied with plural different electric pulses by sequentially varying a voltage value, according to Embodiment 1 of the present invention.

FIG. 8A is a graph showing hysteresis characteristics of variation of resistance values of the variable resistance layer 3 in the case where the variable resistance element 10 according to Embodiment 1 of the present invention is applied with plural different electric pulses by sequentially varying a voltage value. A voltage indicated by the horizontal axis in FIG. 8A indicates a voltage value applied to the first terminal 11 with reference to the second terminal 12. In the variable resistance element 10 in the examination, the variable resistance layer 3 has a thickness of 30 nm, the first tantalum oxide layer 3a has a thickness of 22 nm, and the second tantalum oxide layer 3b has a thickness of 8 nm. A composition of the first tantalum oxide layer 3a is x=1.54 where tantalum oxide is expressed as $TaO_x$, and a composition of the second tantalum oxide layer 3b is y=2.47 where tantalum oxide is expressed as $TaO_y$.

As shown in FIG. 8A, while a voltage value of the voltage pulse is changed from 0 V and reaches approximately −3.0 V, a resistance value of the variable resistance layer 3 remains as an initial resistance value. When the voltage value of the voltage pulse reaches a threshold voltage $V_{L1}$ that is approximately −3.0 V, the resistance value is dramatically decreased. Then, while the voltage value of the voltage pulse is changed from approximately −3.0 V to approximately −3.5 V that is the lowest voltage, and reaches approximately +3.5 V, the resistance value of the variable resistance layer 3 remains low. When the voltage value reaches a threshold voltage $V_{H1}$ that is approximately +3.5 V, the resistance value is getting increased. While the voltage value is changed from the highest voltage that is approximately +4.0 V and reaches approximately +3.3 V, the resistance value of the variable resistance layer 3 is dramatically increased. Then, while the voltage value of the voltage pulse is changed from approximately +3.3 V to 0 V, the resistance value of the variable resistance layer 3 remains high. This is track of a "first cycle" shown by black dots in FIG. 8A.

Next, while the voltage value of the voltage pulse is changed from 0 V and reaches approximately −1.0 V, the resistance value of the variable resistance layer 3 remains high. When the voltage value reaches a threshold voltage $V_{L2}$ that is approximately −1.0 V, the resistance value is dramatically decreased. Then, while the voltage value of the voltage pulse is changed from approximately −1.0 V to approximately −1.5 V that is the lowest voltage, and reaches approximately +1.7 V, the resistance value of the variable resistance layer 3 remains low. When the voltage value reaches a threshold voltage $V_{H2}$ that is approximately +1.7 V, the resistance value is dramatically increased. Then, while the voltage value is changed from the highest voltage that is from approximately +1.7 V to approximately +2.0 V and reaches 0 V, the resistance value of the variable resistance layer 3 remains high. This is track of a "second cycle" shown by black dots in FIG. 8A.

Further, while the voltage value of the voltage pulse is changed from 0 V and reaches approximately −0.7 V, the resistance value of the variable resistance layer 3 remains high. When the voltage value reaches a threshold voltage $V_{L3}$ that is approximately −0.7 V, the resistance value is dramatically decreased. Then, while the voltage value of the voltage pulse is changed from approximately −0.7 V to approximately −1.5 V that is the lowest voltage, and reaches approximately +1.7 V, the resistance value of the variable resistance layer 3 remains low. When the voltage value of the voltage pulse reaches a threshold voltage $V_{L3}$ that is approximately +1.7 V, the resistance value is dramatically increased. Then, while the voltage value is changed from approximately +1.7 V to approximately +2.0 V that is the highest voltage, and reaches 0 V, the resistance value of the variable resistance layer 3 remains high. This is track of a "third cycle" shown by black triangles in FIG. 8A. A track of a "fourth cycle" shown by white triangles is the same as the track of the "third cycle".

Furthermore, the same examination is conducted on another variable resistance element manufactured by changing the thickness of the variable resistance layer included in the variable resistance element 10. In the other variable resistance element, the variable resistance layer 3 has a thickness of 50 nm, the first tantalum oxide layer 3a has a thickness of 45 nm, and the second tantalum oxide layer 3b has a thickness of 5 nm. A composition of the first tantalum oxide layer 3a is x=1.54 where tantalum oxide is expressed as $TaO_x$, and a composition of the second tantalum oxide layer 3b is y=2.47 where tantalum oxide is expressed as $TaO_y$.

Figure 8B:
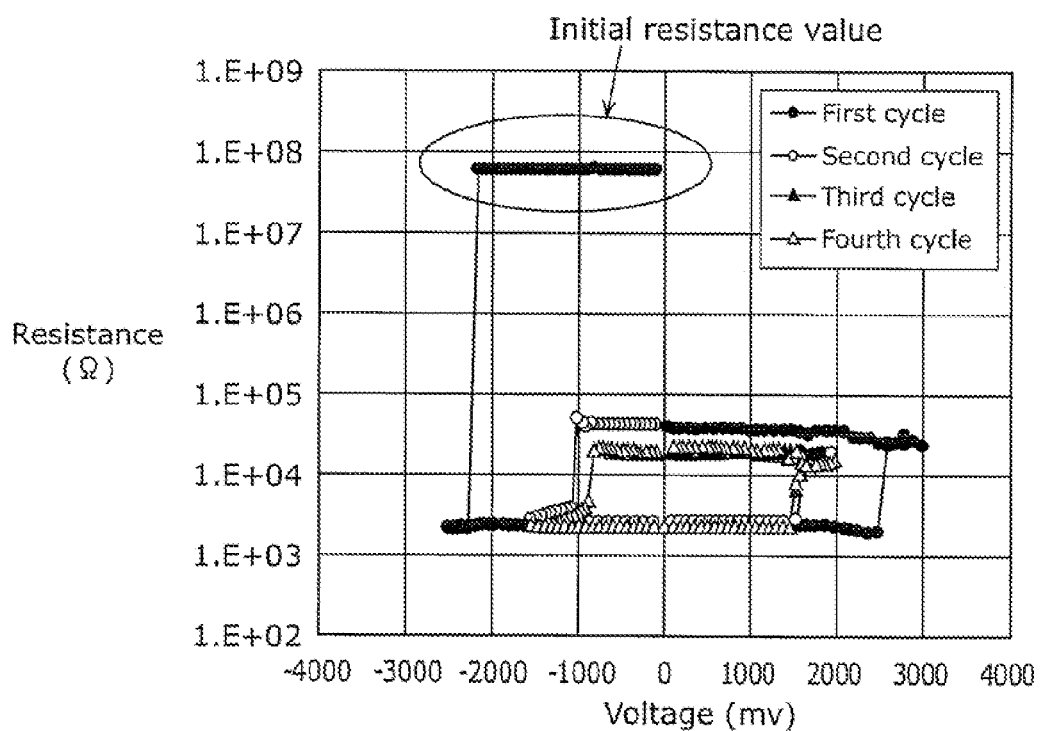
FIG. 8B is a graph showing hysteresis characteristics of another variable resistance element which is manufactured to have a different thickness of the variable resistance layer.

FIG. 8B is a graph showing hysteresis characteristics of the other variable resistance element different from the above variable resistance element. Although characteristics of the variable resistance element of FIG. 8B differs from that of the variable resistance element 10 shown in FIG. 8A in a value of each threshold voltage, both characteristics show similar forms in the graphs.

Results of plural examinations including results of FIGS. 8A and 8B show that hysteresis characteristics of a variable resistance element has the following general properties.

(i) An absolute value of a threshold voltage $V_{Ln}$ that causes a resistance change to low resistance state in the variable resistance layer in the n-th cycle (where n is equal to or more than 1) is maximum in the first cycle where the variable resistance layer is in the initial resistance state, and is decreased in and after the second cycle.

(ii) In each cycle, an absolute value of a threshold voltage $V_{Hn}$ that produces a high resistance state of the variable resistance layer is equal to or greater than an absolute value of a minimum voltage of a voltage pulse having a negative polarity that is applied to achieve a low resistance state of the variable resistance layer in the corresponding cycle.

In FIG. 8A, although a resistance value of the variable resistance layer with the threshold voltage $V_{H1}$ in the first cycle is getting increased, the variable resistance layer is not immediately changed to have a high resistance state. Later observation shows that the above relates to a protection resistance inserted in series in the examination circuit. When a value of the protection resistance is selected appropriately depending on a thickness of the variable resistance layer, hysteresis characteristics plotted in the graph of FIG. 8B, for example, are obtained.

The above-described results show that a first writing step and a first erasing step can be executed when, according to the voltage value hysteresis characteristics of FIG. 8A for example, a voltage value Vw1 of a first writing voltage pulse is set to −3.5 V that is lower than the threshold voltage $V_{L1}$ of approximately −3.0 V and a voltage value Ve1 of a first erasing voltage pulse is set to approximately +4.0 V that is higher than the Vw1.

In addition, since $|V_{L1}|>|V_{L2}|$ and $|V_{H1}|>|V_{H2}|$, it is appropriate that a voltage value Vw2 of a second writing voltage pulse is set to be within a range approximately from −0.7 V to −2.5 V and that a voltage value Ve2 of a second erasing voltage pulse is set to be within a range approximately from +1.7 V to +3.5 V, in order to satisfy the conditions |Vw1|>|Vw2| and |Ve1|>|Ve2|. Therefore, as described previously with reference to FIG. 2, in this embodiment, Vw1 is set to −3.0 V, Vw2 is set to −2.0 V, Ve1 is set to +4.0 V, and Ve2 is set to +2.5 V.

Next, how a size relationship among voltage values of respective voltage pulses influences endurance characteristics of the variable resistance element is described.

Figure 9:
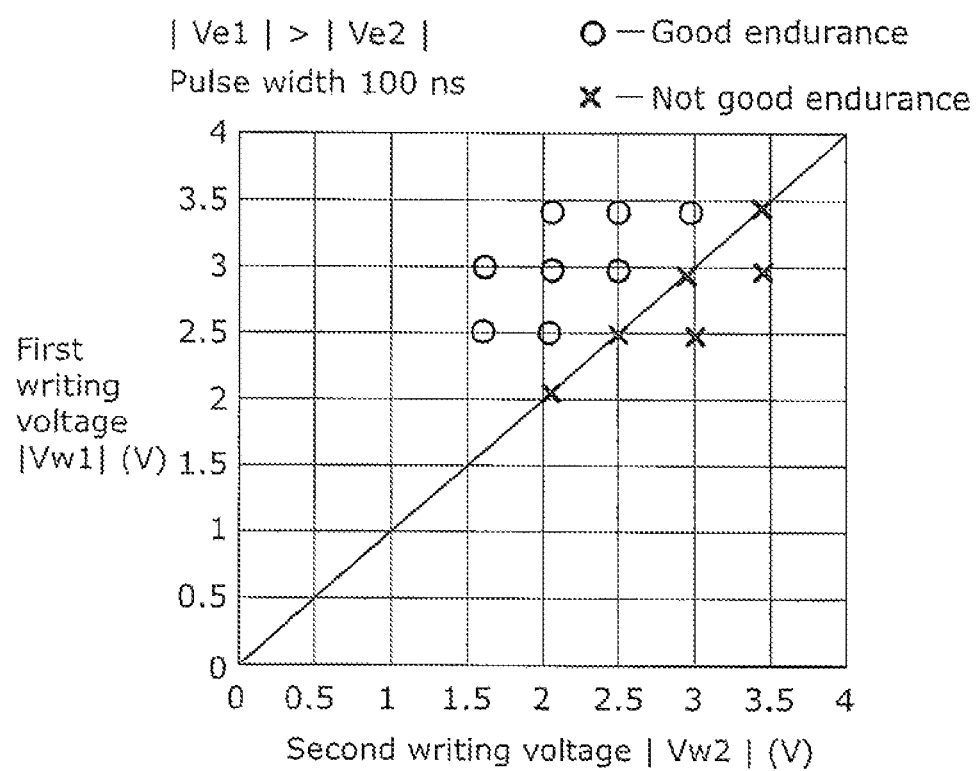
FIG. 9 is a graph showing a result of examination for quality of endurance characteristics in the case of |Ve1|>|Ve2|.
Figure 10:
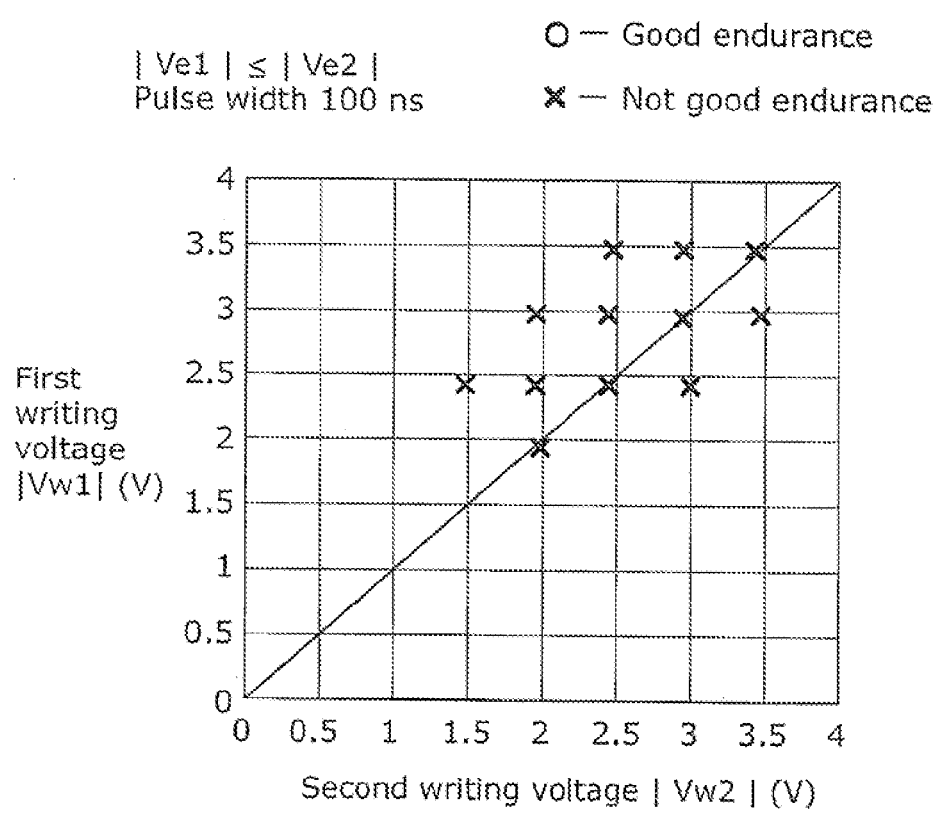
FIG. 10 is a graph showing a result of examination for quality of endurance characteristics in the case of |Ve1|≦|Ve2|.

FIG. 9 is a graph showing a result of examination for quality of endurance characteristics in the case of |Ve1|>|Ve2|. FIG. 10 is a graph showing a result of examination for quality of endurance characteristics in the case of |Ve1|≦|Ve2|. In the graphs, if a stable resistance change is repeated one hundred times, then endurance characteristics are determined as good (shown by circles), and otherwise, endurance characteristics are determined as not good (shown by X marks). A pulse width of each used voltage pulse is 100 ns.

As shown in FIG. 9, if both |Ve1|>|Ve2| and |Vw1|>|Vw2| are satisfied, endurance characteristics are good. On the other hand, as shown in FIGS. 9 and 10, if at least one of |Ve1|>|Ve2| and |Vw1|>|Vw2| is not satisfied, endurance characteristics are not good.

A method of programming the variable resistance element 10 according to this embodiment satisfies both |Ve1|>|Ve2| and |Vw1|>|Vw2|. Therefore, the results of the above examination prove that the variable resistance element 10 according to this embodiment has good endurance characteristics.

First Comparative Example

The following describes a method of programming a variable resistance element according to a first comparative example. A configuration of the variable resistance element programmed by the method according to the first comparative example is the same as that of the variable resistance element 10 in Embodiment 1. Therefore, the configuration of the variable resistance element is not described below.

Figure 11:
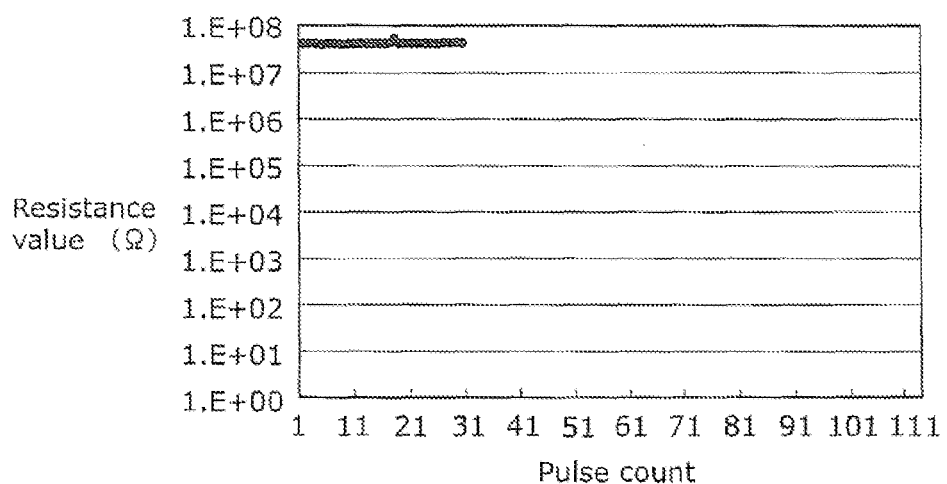
FIG. 11 is a graph showing variation of a resistance state of a variable resistance layer included in a variable resistance element in a first comparative example, in the case where a voltage value of a first writing voltage pulse and a voltage value of a second writing voltage pulse are the same −2.0 V and a voltage value of a first erasing voltage pulse and a voltage value of a second erasing voltage pulse are the same +2.5 V.

FIG. 11 is a graph showing variation of a resistance state of a variable resistance layer included in the variable resistance element according to the first comparative example in the case where both a voltage value Vw1 of a first writing voltage pulse and a voltage value Vw2 of a second writing voltage pulse are the same −2.0 V and both a voltage value Ve1 of a first erasing voltage pulse and a voltage value Ve2 of a second erasing voltage pulse are the same +2.5 V. Here, in any cases, a pulse width is assumed to be 100 ns.

As shown in FIG. 11, in the first comparative example, a resistance value of the variable resistance layer remains in an initial resistance value and does not show any change in its resistance state. Therefore, the variable resistance element according to the first comparative example cannot be used as a memory.

Second Comparative Example

The following describes a method of programming a variable resistance element according to a second comparative example. A configuration of the variable resistance element programmed by the method according to the second comparative example is the same as that of the variable resistance element 10 in Embodiment 1. Therefore, the configuration of the variable resistance element is not described below.

Figure 12:
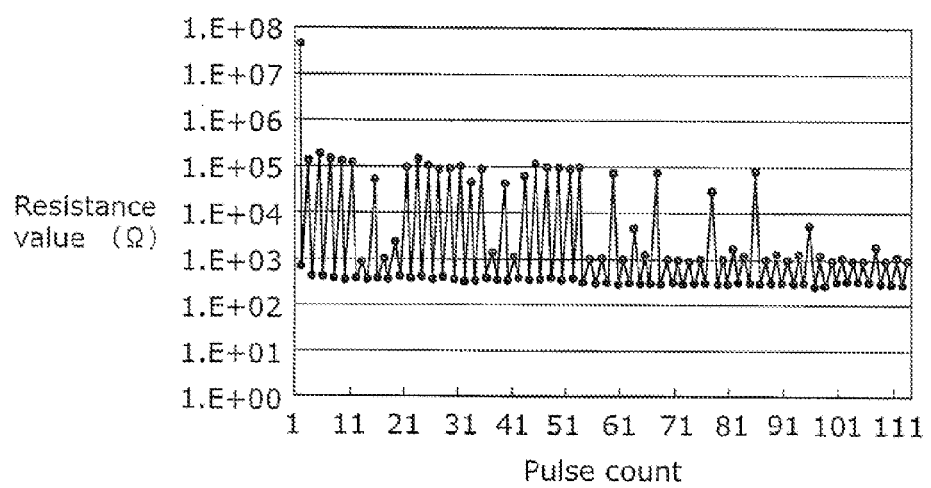
FIG. 12 is a graph showing variation of a resistance state of a variable resistance layer included in a variable resistance element in a second comparative example, in the case where a voltage value of a first writing voltage pulse and a voltage value of a second writing voltage pulse are the same −2.5 V and a voltage value of a first erasing voltage pulse and a voltage value of a second erasing voltage pulse are the same +3.5 V.

FIG. 12 is a graph showing variation of a resistance state of a variable resistance layer included in the variable resistance element according to the second comparative example in the case where both a voltage value Vw1 of a first writing voltage pulse and a voltage value Vw2 of a second writing voltage pulse are the same −3.0 V and both a voltage value Ve1 of a first erasing voltage pulse and a voltage value Ve2 of a second erasing voltage pulse are the same +4.0 V. Here, in any cases, a pulse width is assumed to be 100 ns.

As shown in FIG. 12, in the second comparative example, a resistance state of the variable resistance layer is changed up to a pulse count of 10. However, after that, a difference in a resistance value between a low resistance state and a high resistance state is sometimes considerably small. Then, at and after a pulse count of 90, the difference is always small.

The first and second comparative examples show that the method of programming which satisfies |Vw1|=|Vw2| and |Ve1|=|Ve2| does not allow the variable resistance element to stably operate. On the other hand, the method of programming the variable resistance element 10 according to this embodiment can achieve stable operation as shown in FIG. 3.

As stated above, although the method of programming which satisfies |Vw1|>|Vw2| and |Ve1|>|Ve2| imparts the good endurance characteristics to the variable resistance element 10, there is a case where, in the course of repeating the second writing steps and the second erasing steps many times, variation of resistance values of the variable resistance element 10 occurs after each second writing step and each second erasing step.

In order to consider measures to reduce such variation of the resistance value, the inventors have conducted several experiments in which a pulse width tw1 of the first writing voltage pulse and a pulse width te1 of the first erasing voltage pulse are varied. The experimental results show that increasing the pulse width te1 of the first erasing voltage pulse more than the pulse width tw1 of the first writing voltage pulse is effective in reducing the variation of the resistance value, and that the pulse width te1 of the first erasing voltage pulse is preferably at least ten times as large as the pulse width tw1 of the first writing voltage pulse.

The following describes details of the experiments and a method for programming a variable resistance element for achieving more stable endurance characteristics, which is obtained from the experimental results.

In the experiments, first, each of the first writing step and the first erasing step is performed once by applying, to four variable resistance elements, first writing voltage pulses each having a different pulse width tw1 and first erasing voltage pulses each having a different pulse width te1, respectively, the second writing step and the second erasing step are alternately performed for at least 400 cycles, and a resistance value in a low resistance state LR after the second writing step in each cycle and a resistance value in a high resistance state HR after the second erasing step in each cycle are measured.

Each of FIGS. 13A to 13D is a diagram schematically showing waveforms of the first writing voltage pulse, the first erasing voltage pulse, the second writing voltage pulse, and the second erasing voltage pulse applied to each variable resistance element.

Figure 13A:
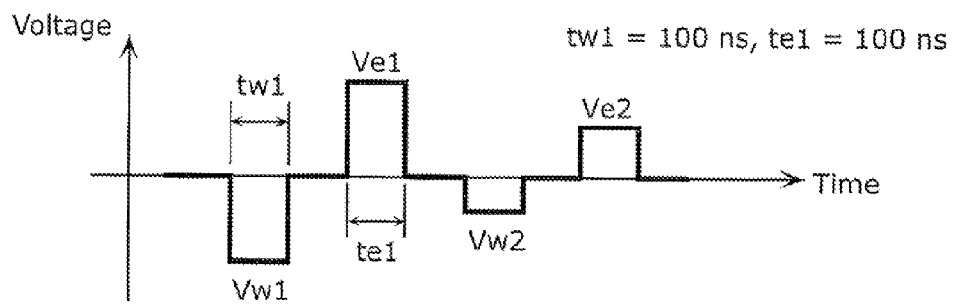
FIG. 13A is a diagram schematically showing examples of waveforms of voltage pulses applied to the variable resistance element.
Figure 13B:
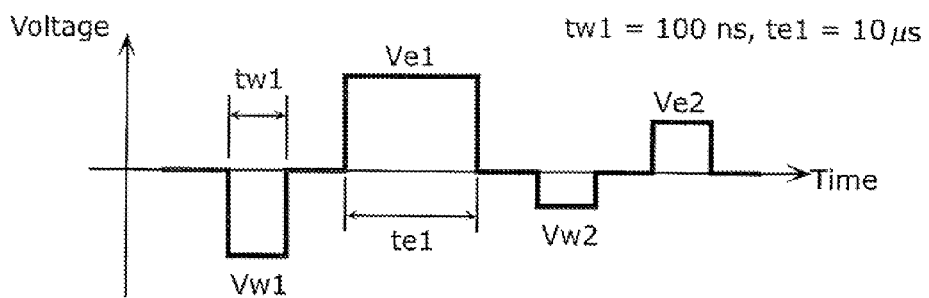
FIG. 13B is a diagram schematically showing examples of waveforms of voltage pulses applied to the variable resistance element.
Figure 13C:
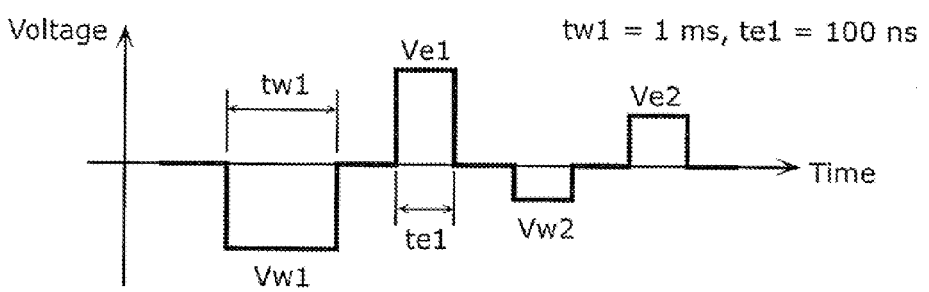
FIG. 13C is a diagram schematically showing examples of waveforms of voltage pulses applied to the variable resistance element.
Figure 13D:
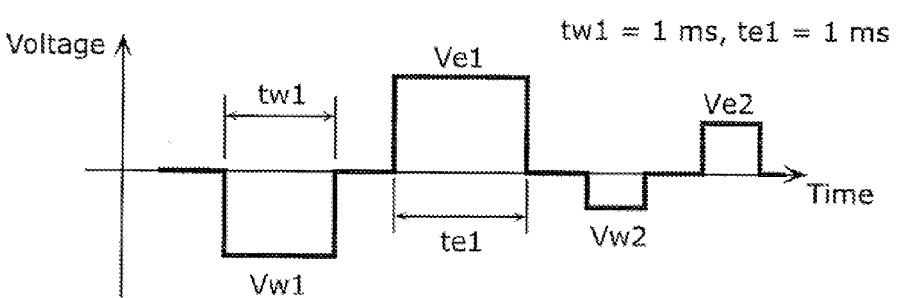
FIG. 13D is a diagram schematically showing examples of waveforms of voltage pulses applied to the variable resistance element.

In detail, tw1 and te1 are equally small 100 ns in FIG. 13A, tw1 is 100 ns and te1 is 10 μs that is larger than tw1 in FIG. 13B, tw1 is 1 ms and te1 is 100 ns that is smaller than tw1 in FIG. 13C, and tw1 and te1 are equally large 1 ms in FIG. 13D.

It is to be noted that, in any of the cases, the preferred conditions described in this embodiment are used as conditions except tw1 and te1. Stated differently, the voltage, value Vw1 of the first writing voltage pulse is −3.0 V, and the voltage value Ve1 of the first erasing voltage pulse is +4.0 V. In addition, the voltage value Vw2 and the pulse width of the second writing voltage pulse are −2.0 V and 100 ns, respectively, and the voltage value Ve2 and the pulse width of the second erasing voltage pulse are +2.5 V and 100 ns, respectively.

In the experiments, an attempt to change a resistance state of each variable resistance element is made by applying, to each variable resistance element, each of the first writing voltage pulse and the first erasing voltage pulse alternately one time, and subsequently each of the second writing voltage pulse and the second erasing voltage pulse alternately at least 400 times.

Each of FIGS. 14A to 14D is a graph showing an example of variation of resistance values of a variable resistance element in the case where the voltage pulse having the waveform shown in each of FIGS. 13A to 13D is applied to the variable resistance element. Here, each resistance value is a value calculated from current flowing in the variable resistance element which is measured by applying such a low readout voltage (specifically 0.4 V) not to change the resistance state of the variable resistance element.

Figure 14A:
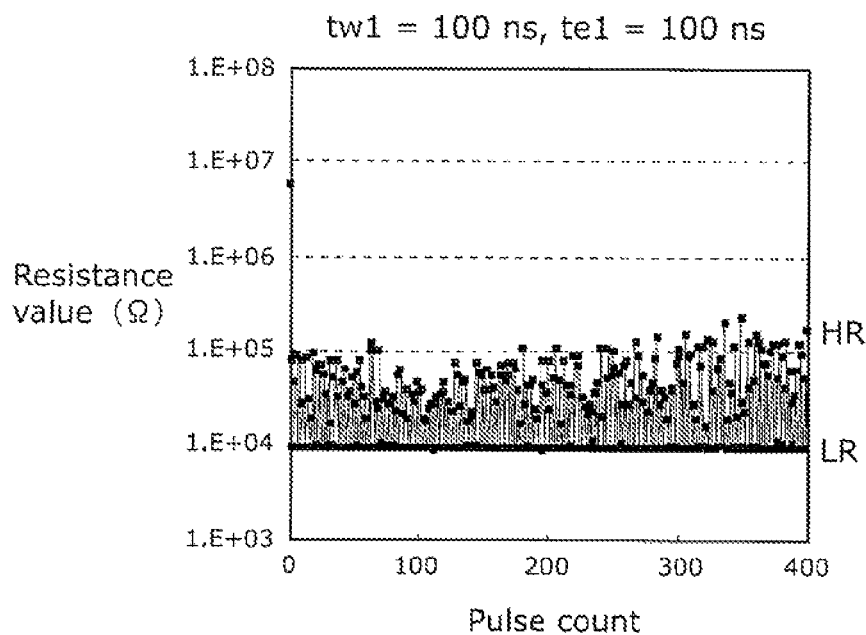
FIG. 14A is a graph showing an example of variation of resistance values of the variable resistance element when the voltage pulse shown in FIG. 13A is applied to the variable resistance element.
Figure 14B:
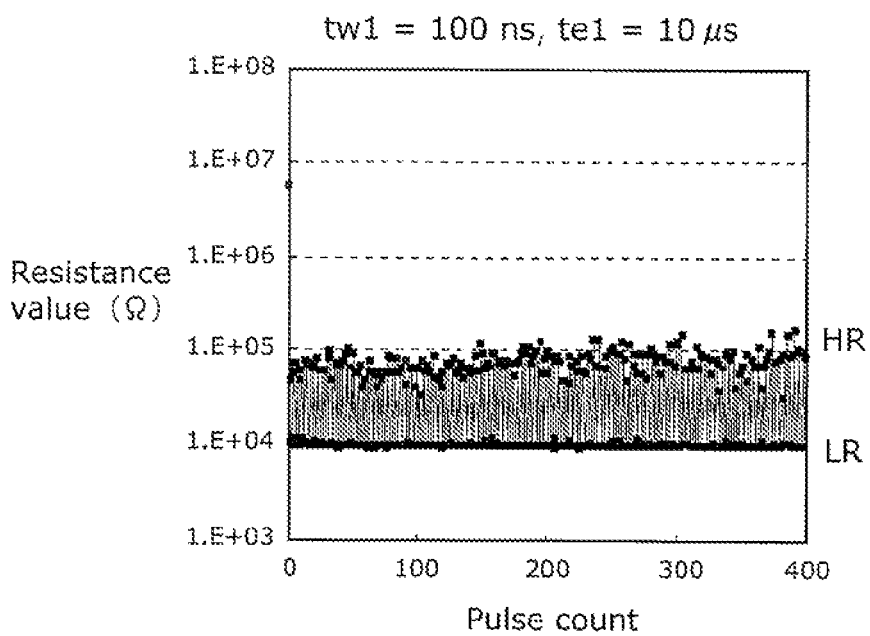
FIG. 14B is a graph showing an example of variation of resistance values of the variable resistance element when the voltage pulse shown in FIG. 13B is applied to the variable resistance element.
Figure 14C:
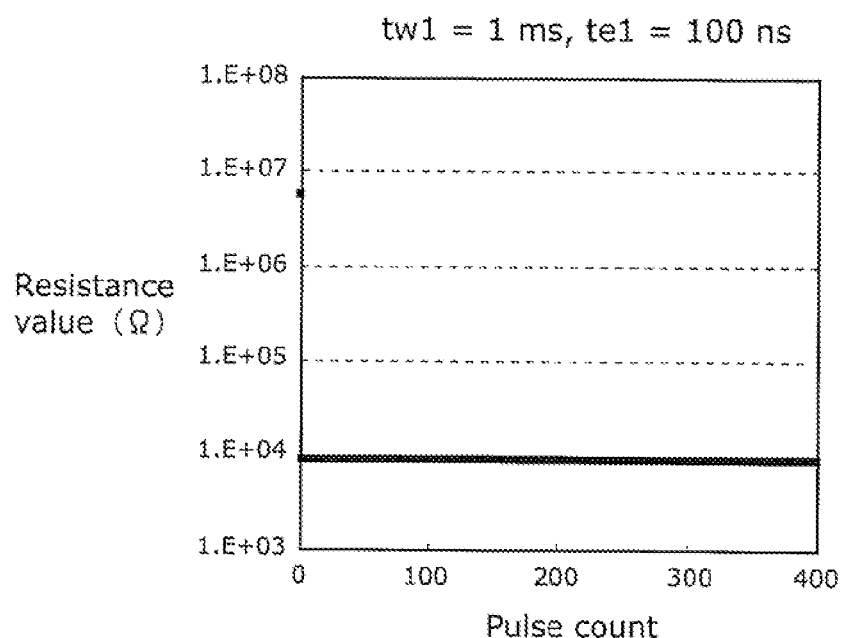
FIG. 14C is a graph showing an example of variation of resistance values of the variable resistance element when the voltage pulse shown in FIG. 13C is applied to the variable resistance element.
Figure 14D:
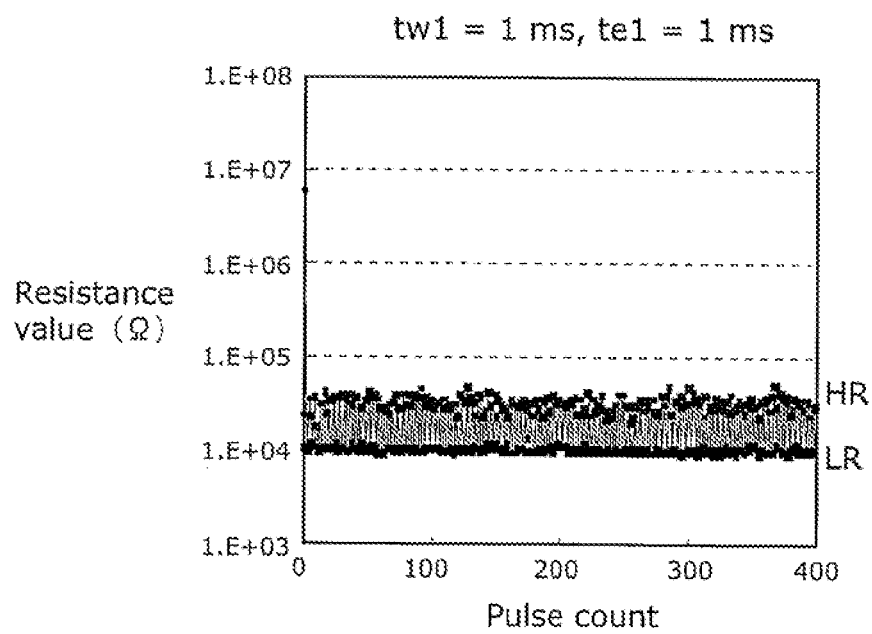
FIG. 14D is a graph showing an example of variation of resistance values of the variable resistance element when the voltage pulse shown in FIG. 13D is applied to the variable resistance element.

When te1 is larger than tw1 (FIG. 14B), the variation of the resistance value in the high resistance state HR is less than the variation when the tw1 and te1 are equally small (FIG. 14A). When te1 is smaller than tw1 (FIG. 14C), the resistance value is not increased at all in the second erasing step, and the variable resistance element does not function as a memory at all. Moreover, when tw1 and te1 are equally large (FIG. 14D), an amount of increase in the resistance value in the second erasing step is small, and a difference between the resistance value in the high resistance state HR and the resistance value in the low resistance state LR becomes smaller.

Each of FIGS. 15A to 15D is a diagram illustrating a distribution of the resistance values shown in a corresponding one of FIGS. 14A to 14D, and is a distribution graph which shows (i) coordinates indicated by each current value measured in the low resistance state LR after the second writing step and a corresponding standard deviation value and (ii) coordinates indicated by each current value measured in the high resistance state HR after the second erasing step and a corresponding standard deviation value.

When tw1 and te1 are equally small (FIG. 15A), a distribution width of the current values in the high resistance state HR is 24 μA (2 μA to 26 μA). In contrast, when te1 is larger than tw1 (FIG. 15B), the distribution width is narrowed to 9

μA (3 μA to 12 μA). However, when te1 and tw1 are equally large (FIG. 15D), the distribution width is narrowed up to 16 μA. The distribution width is the variation of the resistance value. The narrower the distribution width is, the better reproducibility of the resistance value is (the higher repeat accuracy is).

Moreover, when tw1 and te1 are equally small (FIG. 15A), a difference between the maximum current value in the high resistance state HR and the minimum current value in the low resistance state LR is 10 μA. In contrast, when te1 is larger than tw1 (FIG. 15B), the difference is increased to 20 μA. However, when te1 and tw1 are equally large (FIG. 15D), the difference is decreased to 7 μA. The difference is a discrimination window of a resistance state. The larger the difference is, the easier the resistance state is discriminated.

From these experimental results, it is clear that the method of programming which increases the pulse width te1 of the first erasing voltage pulse more than the pulse width tw1 of the first writing voltage pulse is effective in narrowing the distribution width of the resistance values in the high resistance state HR of the variable resistance element and increasing the difference between the resistance value in the high resistance state HR and the resistance value in the low resistance state LR. Using such a method of programming makes it possible to reduce the variation of the resistance value (especially the resistance value in the high resistance state HR) of the variable resistance element, and achieve the more stable endurance characteristics of the variable resistance element.

In order to examine a preferred range of the pulse width te1 of the first erasing voltage pulse with respect to the pulse width tw1 of the first writing voltage pulse, the inventors have further measured current values in the low resistance state LR after the second writing step and current values in the high resistance state HR after the second erasing step for each of cases where the pulse width tw1 of the first writing voltage pulse is fixed to 100 ns and the pulse width te1 of the first erasing voltage pulse is 1 time (100 ns), 10 times (1 μs), 100 times (10 μs), 10000 times (1 ms), or 1000000 times (100 ms) as large as tw1.

Figure 15C:
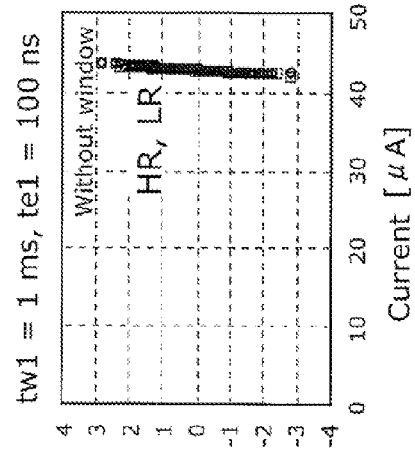
FIG. 15C is a diagram illustrating a distribution of the resistance values shown in the FIG. 14C.
Figure 15D:
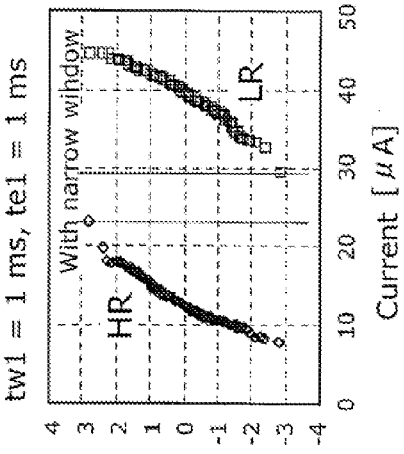
FIG. 15D is a diagram illustrating a distribution of the resistance values shown in the FIG. 14D.
Figure 15A:
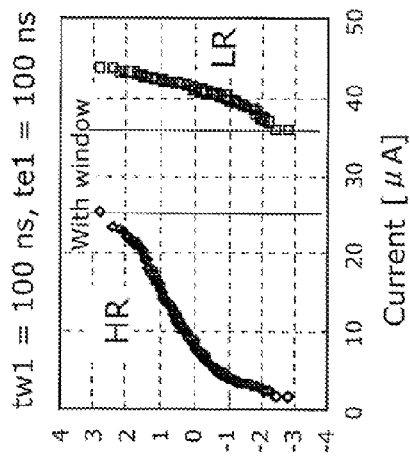
FIG. 15A is a diagram illustrating a distribution of the resistance values shown in the FIG. 14A.
Figure 15B:
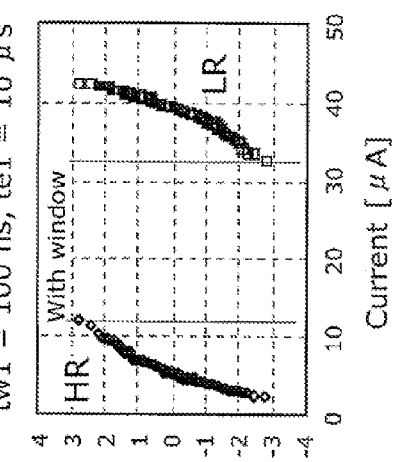
FIG. 15B is a diagram illustrating a distribution of the resistance values shown in the FIG. 14B.

Each of FIGS. 16A to 16E is a diagram illustrating a distribution of the resistance values in a corresponding one of the above cases, and is a distribution graph which shows, using the same notation as FIGS. 15A to 15C, a distribution of the current values measured in the low resistance state LR after the second writing step and the current values measured in the high resistance state HR after the second erasing step. It is to be noted that, for the convenience of comparison, FIGS. 15A and 15B are shown again as FIGS. 16A and 16C, respectively.

As shown in FIGS. 16A to 16E, when the pulse width te1 of the first erasing voltage pulse is 10 times (1 μs) as large as tw1 (FIG. 16B), a distribution width of the current values in the high resistance state HR after the second erasing step is 12 μA (3 μA to 15 μA). The distribution width is not significantly narrowed even when te1 is increased more than 1 μs.

Moreover, when the pulse width te1 of the first erasing voltage pulse is 10 times (1 μs) as large as tw1 (FIG. 16B), a difference between the maximum current value in the high resistance state HR and the minimum current value in the low resistance state LR is 19 μA. The difference is not significantly increased even when te1 is increased more than 1 μs.

From these experimental results, it is clear that using the method of programming in which the pulse width te1 of the first erasing voltage pulse is at least 10 times as large as the pulse width tw1 of the first writing voltage pulse makes it possible to reduce the variation of the resistance value (especially the resistance value in the high resistance state), and achieve the more stable endurance characteristics of the variable resistance element.

In order to find other programming conditions effective in reducing the variation of the resistance value of the variable resistance element, the inventors have conducted several experiments in which the pulse width te1 of the first erasing voltage pulse is changed with respect to a pulse width te2 of the second erasing voltage pulse. As a result, it is found out that the good endurance characteristics can be achieved by increasing the pulse width te1 of the first erasing voltage pulse more than the pulse width te2 of the second erasing voltage pulse.

Further, from these experiments, it is also found out that there are conditions for a pulse width which imparts the good endurance characteristics even though an absolute value of the voltage value Ve1 of the first erasing voltage pulse is equal to an absolute value of the voltage value Ve2 of the second erasing voltage pulse.

The following describes details of the experiments and a method for programming a variable resistance element for achieving more stable endurance characteristics, which is obtained from the experimental results.

Like the above-mentioned experiments, the experiments are conducted using four variable resistance elements.

Figure 17:
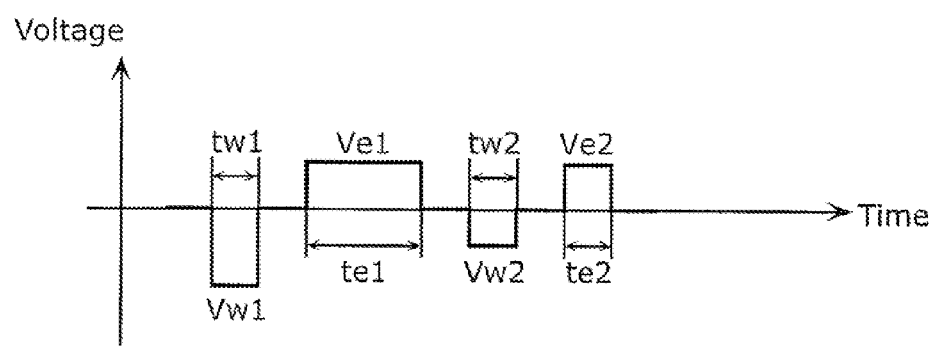
FIG. 17 is a diagram schematically showing examples of waveforms of voltage pulses applied to the variable resistance element.

FIG. 17 is a diagram schematically showing waveforms of first writing voltage pulse, the first erasing voltage pulse; the second writing voltage pulse, and the second erasing voltage pulse applied to the variable resistance element.

In detail, the pulse width te2 of the second erasing voltage pulse is fixed to 100 ns, the pulse width te1 of the first erasing voltage pulse is 1 time (100 ns), 10 times (1 μs), 100 times (10 μs), or 10000 times (1 ms) as large as te2, each voltage pulse having a different waveform is applied to a corresponding one of the variable resistance elements, and current values in the low resistance state LR after the second writing step and current values in the high resistance state HR after the second erasing step are measured.

It is to be noted that, in any of the cases, the conditions except te1 and te2 are that the voltage value Vw1 and the pulse width of the first writing voltage pulse are −3.0 V and 100 ns, respectively, and the voltage value Ve1 of the first erasing voltage pulse is +2.5 V. In addition, the voltage value Vw2 and the pulse width of the second writing voltage pulse are −2.0 V and 100 ns, respectively, and the voltage value Ve2 of the second erasing voltage pulse is +2.5 V.

Each of FIGS. 18A to 18D is a diagram illustrating a distribution of the resistance values obtained when the voltage pulses each having the different waveform are applied to the variable resistance elements, and is a distribution graph which, shows (i) coordinates indicated by each current value measured in the low resistance state LR after the second writing step and a corresponding standard deviation value and (ii) coordinates indicated by each current value measured in the high resistance state HR after the second erasing step and a corresponding standard deviation value.

Although, as shown in FIGS. 18B to 18D, in any of the cases, the upper limit of the distribution of current values in the high resistance state HR is kept to as high as approximately 15 μA and a difference between the maximum current value in the high resistance state HR and the minimum current value in the low resistance state LR (i.e., a window for discriminating a resistance state) is ensured as being widely changed from 23 μA (FIG. 18B) to 19 μA (FIG. 18D), in FIG. 18A, the maximum current value in the high resistance state HR is beyond the lower limit of the distribution of current values including the maximum current value in the low resistance state LR, and there is no window.

From these experimental results, it is clear that the method of programming which increases the pulse width te1 of the first erasing voltage pulse more than the pulse width te2 of the second erasing voltage pulse is effective in narrowing the distribution width of the resistance values in the high resistance state HR of the variable resistance element and increasing the difference between the resistance value in the high resistance state HR and the resistance value in the low resistance state LR. Using such a method of programming makes it possible to reduce the variation of the resistance value (especially the resistance value in the high resistance state HR) of the variable resistance element, and achieve the more stable endurance characteristics of the variable resistance element.

Embodiment 2

Embodiment 2 describes a nonvolatile storage device including the variable resistance element described in Embodiment 1. The following describes a configuration and operation of the nonvolatile storage device.

(Configuration of Nonvolatile Storage Device)

Figure 19:
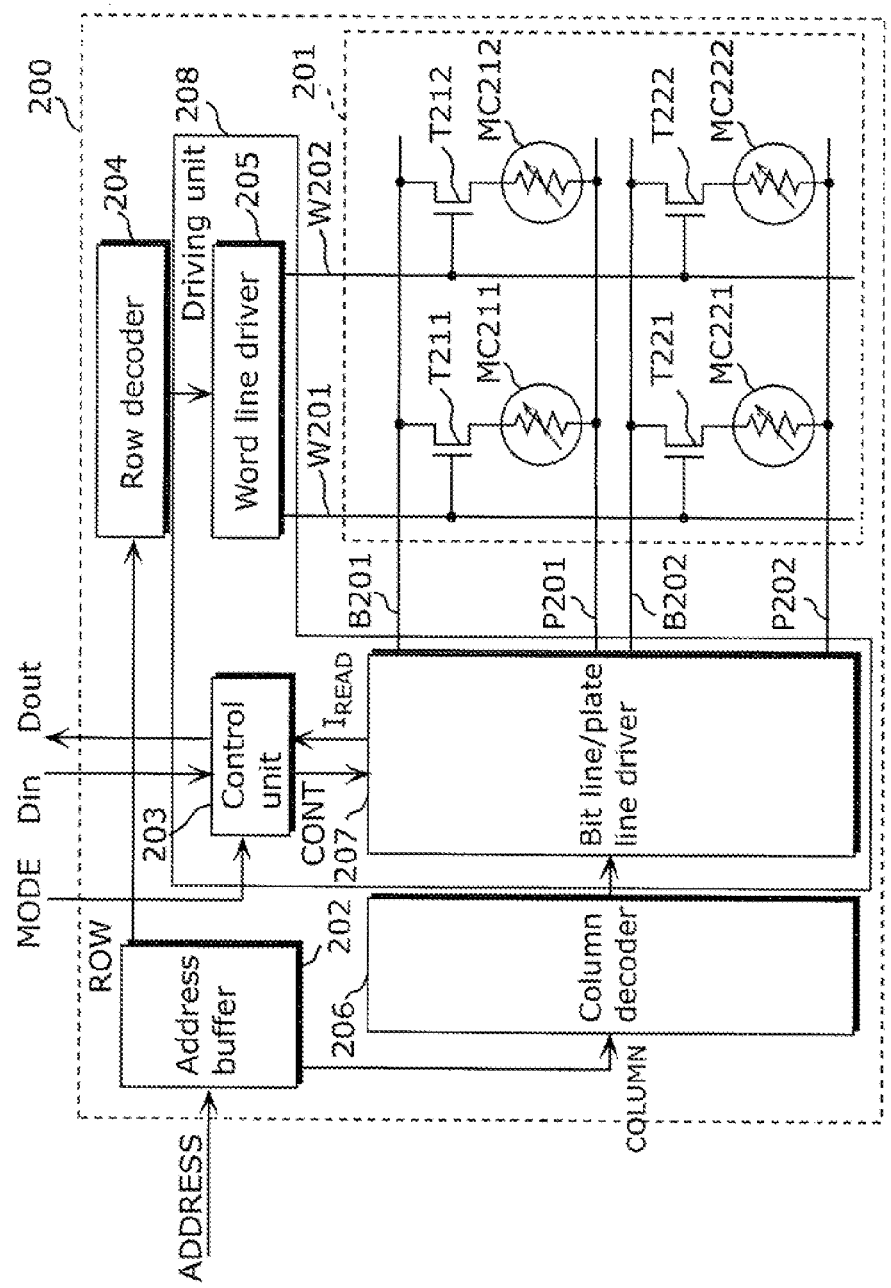
FIG. 19 is a block diagram showing an example of a configuration of a nonvolatile memory device according to Embodiment 2 of the present invention.

FIG. 19 is a block diagram showing an example of a configuration of a nonvolatile memory device according to Embodiment 2 of the present invention. As shown in FIG. 19, the nonvolatile storage device 200 includes: a memory array 201 having variable resistance elements; an address buffer 202; a control unit 203; a row decoder 204; a word line driver 205; a column decoder 206; and a bit line/plate line driver 207. Here, the control unit 203, the word line driver 205, and the bit line/plate line driver 207 are collectively as called a drive unit 208.

As shown in FIG. 19, the memory array 201 includes: two word lines W201 and W202; two bit lines B201 and B202; two plate lines P201 and P202; four transistors T211, T212, T221, and T222; and memory cells MC211, MC212, MC221, and MC222. The word lines W201 and W202 are arranged in a vertical direction. The bit lines B201 and B202 are arranged in a horizontal direction and cross the word lines W201 and W202. The plate lines P201 and P202 are arranged in a horizontal direction and correspond to the bit lines B201 and B202, respectively. The transistors T211, T212, T221, and T222 are arranged in a matrix and each of the transistors corresponds to a corresponding one of crosspoints of the word lines W201 and W202 and the bit lines B201 and B202. The memory cells MC211, MC212, MC221, and MC222 are arranged in a matrix and each of the memory cells corresponds to a corresponding one of the transistors T211, T212, T221, and T222.

The number of each of the above-described constituent elements is not limited to the above. For instance, although it has been described as an example that the memory array 201 has four memory cells, the memory array 201 may have five or more memory cells.

Each of the above-described memory cells MC211, MC212, MC221, and MC222 is the variable resistance element described in Embodiment 1 with reference to FIG. 4. With reference also to FIG. 4, a configuration of the memory array 201 is described in detail below. The transistor T211 and the memory cell MC211 are provided between the bit line B201 and the plate line P201. Here, a source of the transistor T211 and the first terminal 11 of the memory cell MC211 are arranged in series to be connected to each other. The configuration is explained in more detail below. The transistor T211 is arranged between the bit line B201 and the memory cell MC211 and connected to the bit line B201 and the memory cell MC211. The memory cell MC211 is arranged between the transistor T211 and the plate line P201 and connected to the transistor T211 and the plate line P201. A gate of the transistor T211 is connected to the word line W201.

The other three transistors T212, T221, and T222 are arranged in series with the other three memory cells MC212, MC221, and MC222, respectively, and they are connected in the same manner as described for the transistor T211 and the memory cell MC211. Therefore, the connection arrangement is not explained again.

With the above configuration, when gates of the transistors T211, T212, T221, and T222 are applied with a predetermined voltage (activation voltage) via the word lines W201 and W202, drains and sources of the transistors T211, T212, T221, and T22 are conducted.

The address buffer 202 receives address signals ADDRESS from an external circuit (not shown), and then, based on the received address signals ADDRESS, provides row address signals ROW to the row decoder 204 and column address signals COLUMN to the column decoder 206. The address signals ADDRESS are signals indicating an address of a memory cell selected from the memory cells MC211, MC212, MC221, and MC222. The row address signals ROW are signals indicating an address of a row of the address indicated in the address signals ADDRESS. The column address signals COLUMN are signals indicating an address of a column of the address indicated in the address signals ADDRESS.

The control unit 203 selects at least one of a write mode, a reset mode, and a read mode, based on a mode selection signal MODE received from the external circuit.

In the write mode, the control unit 203 provides a control signal CONT instructing to "apply a writing voltage", to the bit line/plate line driver 207, based on input data Din received from the external circuit.

In the case of the read mode, the control unit 203 provides a control signal CONT instructing to "apply a read voltage", to the bit line/plate line driver 207. In the read mode, the control unit 203 further receives a signal $I_{READ}$ from the bit line/plate line driver 207, and provides the external circuit with output data Dout indicating a bit value corresponding to the signal $I_{READ}$. The signal $I_{READ}$ is a signal indicating a current value of current flowing in the plate lines P201 and P202 in the read mode.

In the reset mode, the control unit 203 provides a control signal CONT instructing to "apply a reset voltage", to the bit line/plate line driver 207.

The row decoder 204 receives the row address signals ROW from the address buffer 202, and based on the row address signals ROW, selects one of the two word lines W201 and W202. Based on the output signal of the row decoder 204, the word line driver 205 applies an activation voltage to the word line selected by the row decoder 204.

The column decoder 206 receives the column address signals COLUMN from the address buffer 202, and based on the column address signals COLUMN, selects one of the two bit lines B201 and B202 and also selects one of the two plate lines P201 and P202.

When the bit line/plate line driver 207 receives the control signal CONT instructing to "apply the writing voltage" from the control unit 203, the bit line/plate line driver 207 applies a writing voltage $V_{WRITE}$ to the bit line selected by the column decoder 206 and sets the plate line selected by the column decoder 206 to be grounded, based on the output signal of the column decoder 206.

When the bit line/plate line driver 207 receives the control signal CONT instructing to "apply the read voltage" from the control unit 203, the bit line/plate line driver 207 applies a read voltage $V_{READ}$ to the bit line selected by the column decoder 206 and sets the plate line selected by the column decoder 206 to be grounded, based on the output signal of the column decoder 206. Then, the bit line/plate line driver 207 provides the control unit 203 with the signal $I_{READ}$ indicating a current value of current flowing in the selected plate line.

When the bit line/plate line driver 207 receives the control signal CONT instructing to "apply the reset voltage" from the control unit 203, the bit line/plate line driver 207 applies a reset voltage $V_{RESET}$ to the bit line selected by the column decoder 206 and sets the plate line selected by the column decoder 206 to be grounded, based on the output signal of the column decoder 206.

Here, in order to achieve the method of programming described in Embodiment 1, a voltage value of the writing voltage $V_{WRITE}$ is set to −3.5 V for a first writing step and −2.5 V for a second writing step, and a pulse width of the writing voltage $V_{WRITE}$ is set to 100 ns, for example. Further, a voltage value of the read voltage $V_{READ}$ is set to +0.4 V, for example. Furthermore, a voltage value of the reset voltage $V_{RESET}$ is set to +4.0 V for a first erasing step and +2.5 V for a second erasing step, and a pulse width of the reset voltage $V_{RESET}$ is set to 10 µs for the first erasing step and 100 ns for the second erasing step, for example. It is to be noted that the pulse width in the first erasing step is set larger than, or preferably at least 10 times as large as, the pulse width in the first writing step.

Moreover, in the other preferred programming conditions, the voltage value of the writing voltage $V_{WRITE}$ is set to, for example, −3.0 V for, the first writing step and −2.0 V for the second writing step, and the pulse width of the writing voltage $V_{WRITE}$ is set to 100 ns. Further, the voltage value of the read voltage $V_{READ}$ is set to +0.4 V, for example. Furthermore, the voltage value of the reset voltage $V_{RESET}$ is set to +2.5 V for the first erasing step and +2.5 V for the second erasing step, and the pulse width of the reset voltage $V_{RESET}$ is set to 10 µs for the first erasing step and 100 ns for the second erasing step, for example. It is to be noted that the pulse width in the first erasing step is set larger than, or preferably at least 10 times as large as, the pulse width in the second erasing step.

The voltage pulses having such different voltage values and pulse widths are generated using, for example, a voltage generation circuit (not shown) which is capable of generating a number of voltages with a number of pulse widths. The following describes in detail an example of a method of determining whether a voltage pulse having which voltage value is generated with which voltage width, using an example operation.

(Operation of Nonvolatile Storage Device)

The example operation of the nonvolatile storage device 200 thus configured is described for each of: the write mode (mode for writing input data Din to a memory cell); the reset mode (mode for resetting the data written into the memory cell); and the read mode (mode for outputting (reading out) the data written into the memory cell from the memory as output data Dout). Here, the first writing step and the second writing step described above are executed in the write mode, and the first erasing step and the second erasing step described above are executed in the reset mode.

For convenience in the explanation, it is assumed that the mode selection signal MODE includes information designating which of the first writing step and the second writing step is to be executed in the write mode, and designating which of the first erasing step and the second erasing step is to be executed in the reset mode. Using the mode selection signal MODE, the external circuit instructs the control unit 203 which of the first writing step, the second writing step, the first erasing step, and the second erasing step is to be executed.

It is also assumed that the address signals ADDRESS are signals indicating an address of the memory cell MC211.

(Write Mode)

The control unit 203 receives input data Din from the external circuit. Here, if the input data Din is "1", then the control unit 203 provides the control signal CONT instructing to "apply the writing voltage", to the bit line/plate line driver 207. On the other hand, if the input data Din is "0", then the control unit 203 does not provide the control signal CONT.

The control signal CONT instructing to "apply the writing voltage" includes information indicating which of the first writing voltage pulse and the second writing voltage pulse is to be applied to a target memory cell according to the designation of the mode selection signal MODE.

When the bit line/plate line driver 207 receives the control signal CONT instructing to "apply the writing voltage", from the control unit 203, the bit line/plate line driver 207 applies the writing voltage $V_{WRITE}$ to the bit line B201 selected by the column decoder 206. In addition, the bit line/plate line driver 207 sets the plate line P201, which is selected by the column decoder 206, to be grounded.

Here, the word line W201 selected by the row decoder 204 is applied with an activation voltage by the word line driver 205. Therefore, the drain and the source of the transistor T211 are conducted.

Thus, in the first writing step, the first writing voltage pulse having a voltage value of −3.5 V and a pulse width of 100 ns is applied to the memory cell MC211 as the writing voltage $V_{WRITE}$. Then, in the second writing step, the second writing voltage pulse having a voltage value of −2.5 V and a pulse width of 100 ns is applied to the memory cell MC211 as the writing voltage $V_{WRITE}$. Thus, the state of the memory cell MC211 is changed from the high resistance state to the low resistance state. On the other hand, no writing voltage pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, only the memory cell MC211 can be changed to the low resistance state, which allows one bit data indicating "1" corresponding to the low resistance state to be written into the memory cell MC211 (one bit data to be stored).

When the writing into the memory cell MC211 is completed, new address signals ADDRESS are provided to the address buffer 202, and the above-described operation of the write mode of the nonvolatile storage device 200 is repeated for the other memory cells except the memory cell MC211.

(Read Mode)

The control unit 203 provides the control signal CONT instructing to "apply the read voltage", to the bit line/plate line driver 207.

When the bit line/plate line driver 207 receives the control signal CONT instructing to "apply the read voltage", from the control unit 203, the bit line/plate line driver 207 applies the read voltage $V_{READ}$ to the bit line 8201 selected by the column decoder 206. In addition, the bit line/plate line driver 207 sets the plate line P201, which is selected by the column decoder. 206, to be grounded.

Here, the word line W201 selected by the row decoder 204 is applied with an activation voltage by the word line driver 205. Therefore, the drain and the source of the transistor T211 are conducted.

Thus, as the read voltage $V_{READ}$, the voltage of +0.4 V is applied to the memory cell MC211. As a result, current having a current value corresponding to a resistance value of the memory cell MC211 flows into the plate line P201 via the memory cell MC212.

Here, no measurement voltage is applied to the memory cells MC221 and MC222, and no activation voltage is applied to the gate of the transistor T212 connected in series with the memory MC212. Therefore, the above current does not flow in the memory cells MC212, MC221, and MC222.

Next, the bit line/plate line driver 207 measures a current value of current flowing in the plate line P201, and provides the control unit 203 with the signal $I_{READ}$ indicating the measured value.

The control unit 203 provides the outside with output data Dout corresponding to the current value indicated by the signal $I_{READ}$. For example, if the current value indicated by the signal $I_{READ}$ is a current value of current flowing at the time when the memory cell MC211 is in the low resistance state, then the control unit 203 outputs output data Dout indicating "1".

Thus, current depending on the resistance value of the memory cell MC211 flows only to the memory cell MC211 and then to the plate line P201. As a result, one bit data indicating "1" is read out from the memory cell MC211 (in other words, one bit data is read out).

When the reading out from the memory cell MC211 is completed, new address signals ADDRESS are provided to the address buffer 202, and the above-described operation of the read mode of the nonvolatile storage device 200 is repeated for the other memory cells except the memory cell MC211.

(Reset Mode)

The control unit 203 provides the control signal CONT instructing to "apply the reset voltage", to the bit line/plate line driver 207.

The control signal CONT instructing to "apply the reset voltage" includes information indicating which of the first erasing voltage pulse and the second erasing voltage pulse is to be applied to a target memory cell according to the designation of the mode selection signal MODE. As stated above, the pulse width of the first erasing voltage pulse is larger than, or preferably 10 times as large as, the pulse width of the first writing voltage pulse.

When the bit line/plate line driver 207 receives the control signal CONT instructing to "apply the reset voltage", from the control unit 203, the bit line/plate line driver 207 applies the reset voltage $V_{RESET}$ to the bit line B201 selected by the column decoder 206. In addition, the bit line/plate line driver 207 sets the plate line P201 selected by the column decoder 206, to be grounded.

Here, the word line W201 selected by the row decoder 204 is applied with an activation voltage by the word line driver 205. Therefore, the drain and the source of the transistor T211 are conducted.

Therefore, in the first erasing step, the first erasing voltage pulse having a voltage value of +4.0 V and a pulse width of 10 µs is applied to the memory cell MC211 as the reset voltage $V_{RESET}$. Then, in the second erasing step, the second erasing voltage pulse having a voltage value of +2.5 V and a pulse width of 100 ns is applied to the memory cell MC211 as the reset voltage $V_{RESET}$. Thus, the state of the memory cell MC211 is changed from the low resistance state to the high resistance state. On the other hand, no erasing voltage pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, only the memory cell MC211 can be changed to the high resistance state. This allows one bit data, which is stored in the memory cell MC211 and indicates "1" corresponding to the low resistance state, to be reset to "0" corresponding to the high resistance state.

When the resetting of the memory cell MC211 is completed, new address signals ADDRESS are provided to the address buffer 202, and the above-described operation of the reset mode of the nonvolatile storage device 200 is repeated for the other memory cells except the memory cell MC211.

As described above, the nonvolatile storage device 200 sets, in the write mode, an absolute value of the voltage value of the first writing voltage pulse to be greater than an absolute value of the voltage value of the second writing voltage pulse, and sets, in the reset mode, an absolute value of the voltage value of the first erasing voltage pulse to be greater than an absolute value of the voltage value of the second erasing voltage pulse. Thus, stable operation and good endurance characteristics can be achieved.

It is also possible as a different configuration that the nonvolatile storage device automatically executes a first writing step and a first erasing step as initialization for all memory cells.

In such a nonvolatile storage device, the control unit further includes: a flag register that indicates whether or not the initialization has been completed; and an address counter that can designate all memory cells sequentially, for example (not shown).

The control unit executes the first writing step and the first erasing step for each of the memory cells sequentially designated by the address counter, and then updates a value in the flag register to indicate the completion of the initialization. Then, according to access from an external circuit, the control unit executes the second writing step and the second erasing step.

Embodiment 3

Embodiment 3 describes a crosspoint nonvolatile storage device including the variable resistance element described in Embodiment 1. Here, the crosspoint nonvolatile storage device is a storage device in which an active layer is provided at each of crosspoints (three-dimensional crosspoints) of a word line and a bit line.

The following describes a configuration and operation of the nonvolatile storage device according to Embodiment 3.

(Configuration of Nonvolatile Storage Device)

Figure 20:
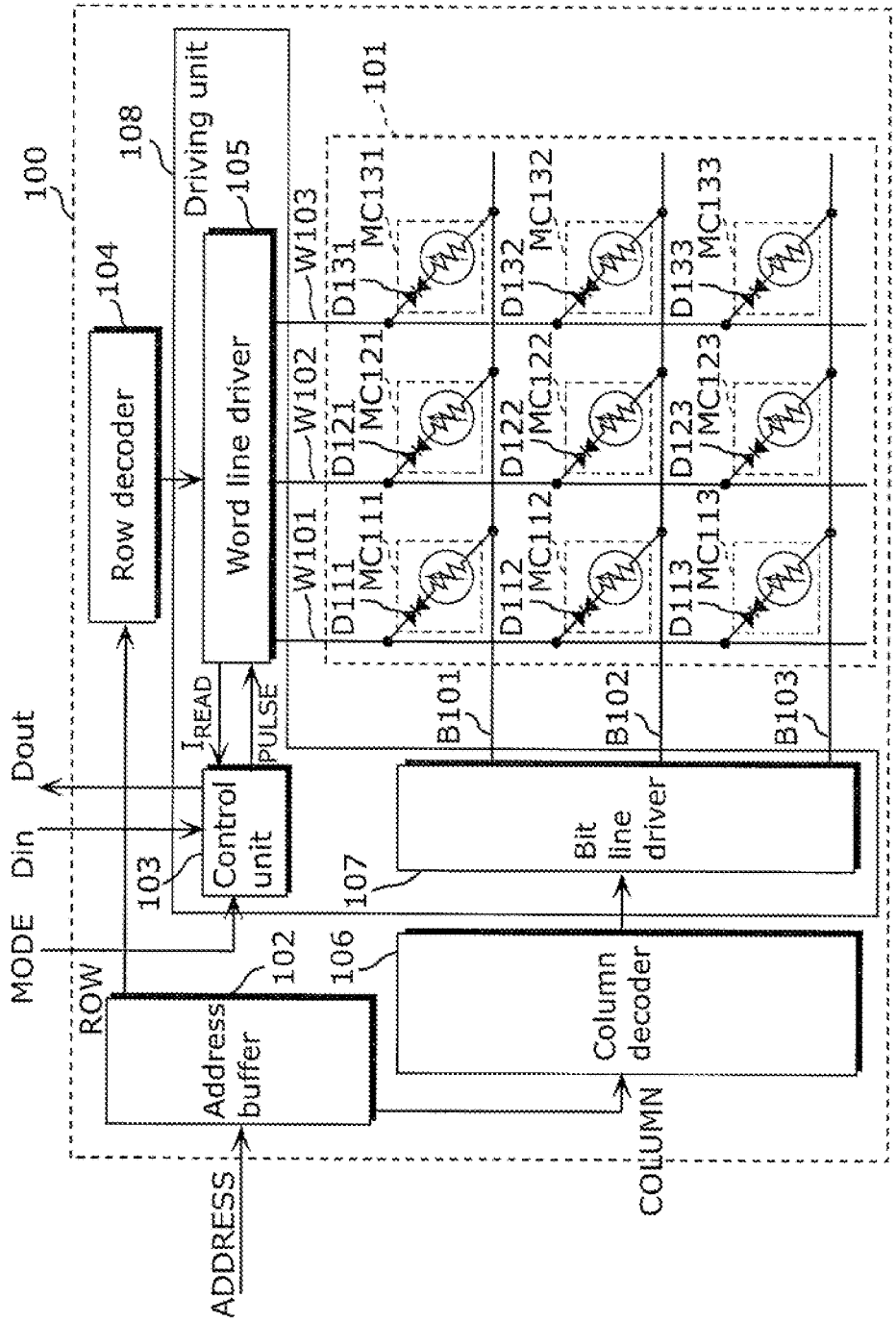
FIG. 20 is a block diagram showing an example of a configuration of a nonvolatile memory device according to Embodiment 3 of the present invention.

FIG. 20 is a block diagram showing an example of a configuration of the nonvolatile memory device according to Embodiment 3 of the present invention. As shown in FIG. 20, the crosspoint nonvolatile storage device 100 includes a memory array 101, an address buffer 102, a control unit 103, a row decoder 104, a word line driver 105, a column decoder 106, and a bit line/plate line driver 107. The memory array 101 includes the variable resistance elements. Here, the control unit 103, the word line driver 105, and the bit line/plate line driver 107 are collectively called as a drive unit 108.

As shown in FIG. 20, the memory array 101 includes a plurality of word lines W101, W102, W103, ... and a plurality of bit lines B101, B102, B103, . . . . The word lines W101, W102, W103, ... are arranged in parallel in a vertical direction. The bit lines B101, B102, B103, . . . are arranged in parallel in a horizontal direction and cross the word lines W101, W102, W103, . . . . Furthermore, the word lines W101, W102, W103, . . . are arranged on a first plane in parallel to a main plane of a substrate (not shown), and the bit lines B101, B102, B103, . . . are arranged on a second plane that is above the first plane and in substantially parallel to the first plane. Therefore, the word lines W101, W102, W103, . . . cross the bit lines B101, B102, B103, . . . three-dimensionally. At the three-dimensional crosspoints, there are provided a plurality of memory cells MC111, MC112, MC113, MC121, MC122, MC123, MC131, MC132, MC133, . . . (hereinafter, referred to as "memory cells MC111, MC112, . . . ").

In each of the memory cells MC, a variable resistance element is connected in series with a corresponding one of current steering elements D111, D112, D113, D121, D122, D123, D131, D132, D133 each of which includes, for instance, a bidirectional diode. In addition, the variable resistance element is connected to a corresponding one of the bit lines B101, B102, B103, . . . , and each current steering element is connected to a corresponding one of the variable resistance elements and a corresponding one of the word lines W101, W102, W103, . . . . It is to be noted that the variable resistance element 10 according to Embodiment 1 may be used as the variable resistance element.

The address buffer 102 receives address signals ADDRESS from an external circuit (not shown), and then, based on the received address signals ADDRESS, provides row address signals ROW to the row decoder 104 and column address signals COLUMN to the column decoder 106. The address signals ADDRESS are signals indicating an address of a memory cell selected from the memory cells MC112, MC121, . . . . The row address signals ROW are signals indicating an address of a row of the address indicated in the address signals ADDRESS. The column address signals COLUMN are signals indicating an address of a column of the address indicated in the address signals ADDRESS.

The control unit 103 selects one of the write mode (corresponding to the first and second writing steps and the first and second erasing steps) and the read mode, based on a mode selection signal MODE received from the external circuit.

In the write mode, the control unit 103 applies a writing voltage pulse or an erasing voltage pulse to the word line driver 105, based on input data Din received from the external circuit.

Then, in the read mode, the control unit 103 applies a readout (read) voltage to the word line driver 105. In the read mode, the control unit 103 further receives a signal $I_{READ}$ from the word line driver 105, and provides the external circuit with output data Dout indicating a bit value depending on the signal $I_{READ}$. The signal $I_{READ}$ is a signal indicating a current value of current flowing in the word lines W101, W102, W103, . . . during the read mode.

The row decoder 104 receives the row address signals ROW from the address buffer 102, and based on the row address signals ROW, selects one of the word lines W101, W102, W103, . . . . Based on the output signal of the row decoder 104, the word line driver 105 applies an activation voltage to the word line selected by the row decoder 104.

The column decoder 106 receives the column address signals COLUMN from the address buffer 102, and selects one of the bit lines B101, B102, B103, . . . based on the column address signals COLUMN.

The bit line driver 107 sets the bit line selected by the column decoder 106, to be grounded, based on the output signal of the column decoder 106.

It is to be noted that although the crosspoint storage device in this embodiment is a single-layer crosspoint storage device, the crosspoint storage device may be configured as a multi-layer crosspoint storage device by stacking memory arrays.

It is to be noted that a positional relationship may be exchanged between the variable resistance element and the current steering element. More specifically, it is also possible that the word lines are connected to the variable resistance elements and the bit lines are connected to the current steering elements.

It is also possible that one or both of a bit line and a word line supplies power to a variable resistance element. In more detail, it is possible that one of the bit line and the word line is grounded and the other line that is not grounded applies a power voltage to the variable resistance element. Or, it is also possible that both of the bit line and the word line are applied with different power voltages other than a ground voltage, and power is supplied to the variable resistance element based on a predetermined voltage difference between the bit line and the word line.

(Operation of Nonvolatile Storage Device)

The example operation of the nonvolatile storage device 100 thus configured is described for each of the write mode and the read mode. Here, since known methods can be used for selecting a bit line or a word line and for applying a voltage pulse, the methods are not described in detail below.

For convenience in the explanation, it is assumed that a mode selection signal MODE includes information designating whether the write mode corresponds to the first writing step, the second writing step, the first erasing step, or the second erasing step. Using the mode selection signal MODE, an external circuit instructs the control unit 103 which of the first writing step, the second writing step, the first erasing step, and the second erasing step is to be executed.

In the following, it is assumed that writing and reading are executed for the memory cell MC122.

(Write Mode)

When one bit data indicating "1" is written (stored) into the memory cell MC122, the bit line driver 107 sets the bit line B102 to be grounded and the word line driver 105 electrically connects the word line W102 to the control unit 103. Then, the control unit 103 performs control to apply a writing voltage pulse to the word line W102.

Here, in order to achieve the method of programming described in Embodiment 1, a voltage value of the writing voltage pulse is set to −3.5 V in the first writing step and −2.5 V in the second writing step, respectively, according to the designation of the mode selection signal MODE. In addition, a pulse width of the writing voltage pulse is set to 100 ns in both of the first and second writing steps.

Moreover, in the other preferred programming conditions, a voltage value of the writing voltage pulse is set to −3.0 V for the first writing step and −2.0 V for the second writing step, and a pulse width of each of the voltages is set to 100 ns.

The above-described operation allows the writing voltage pulse to be applied to the variable resistance element in the memory cell MC122. As a result, the state of the variable resistance element in the memory cell MC122 is changed to the low resistance state corresponding to "1".

On the other hand, when one bit data indicating "0" is written (stored) into the memory cell MC122, the bit line driver 107 sets the bit line 8102 to be grounded and the word line driver 105 electrically connects the word line W102 to the control unit 103. Then, the control unit 103 performs control to apply an erasing voltage pulse to the word line W102.

Here, in order to achieve the method of programming described in Embodiment 1, for instance, a voltage value of the erasing voltage pulse is set to +4.0 V in the first erasing step and +2.5 V in the second writing step, respectively, according to the designation of the mode selection signal MODE. In addition, a pulse width of the erasing voltage pulse is set to 10 µs for the first erasing step and 100 ns for the second erasing step. It is to be noted that the pulse width of the erasing voltage pulse in the first erasing step is set larger than, or preferably 10 times as large as, the pulse width of the writing voltage pulse in the first writing step.

Moreover, in the other preferred programming conditions, a voltage value of the erasing voltage pulse is set to +2.5 V for each of the first erasing step and the second erasing step. In addition, a pulse width of the erasing voltage pulse is set to 10 µs for the first erasing step and 100 ns for the second erasing step. It is to be noted that the pulse width of the erasing voltage pulse in the first erasing step is set larger than, or preferably 10 times as large as, the pulse width of the erasing voltage pulse in the second erasing step.

The above-described operation allows the writing voltage pulse to be applied to the variable resistance element in the memory cell MC122. As a result, the state of the variable resistance element in the memory cell MC122 is changed to the high resistance state corresponding to "0".

(Read Mode)

When data is read out from the memory cell MC122, the bit line driver 107 sets the bit line B102 to be grounded and the word line driver 105 electrically connects the word line W102 to the control unit 103. Then, the control unit 103 performs control to apply a read voltage to the word line W102. Here, a voltage value of the read voltage is set to +0.4 V.

When the read voltage is applied to the memory cell MC122, current having a current value corresponding to a resistance value of the variable resistance layer in the memory cell MC122 flows between the bit line B102 and the word line W102. The control unit 103 detects the current value of the current, and detects the resistance state of the memory cell MC122 based on the current value and the read voltage.

If the variable resistance layer in the memory cell MC122 is in the low resistance state, then it is determined that the data written into the memory cell MC122 is "1". On the other hand, if the variable resistance layer in the memory cell MC122 is in the high resistance state, then it is determined that the data written into the memory cell MC122 is "0".

As described above, in the write mode, the nonvolatile storage device 100 sets an absolute value of the voltage value of the first writing voltage pulse to be greater than an absolute value of the voltage value of the second writing voltage pulse, and sets an absolute value of the voltage value of the first erasing voltage pulse to be greater than an absolute value of the voltage value of the second erasing voltage pulse. Thus, stable operation and good endurance characteristics can be achieved.

Likewise the nonvolatile storage device according to the previous embodiment, the nonvolatile storage device according to this embodiment may automatically execute the first writing step and the first erasing step as initialization for all memory cells.

Other Embodiments

In the method of programming a variable resistance element and the nonvolatile storage device performing such a method described in the embodiments, there is a case where writing in a second writing step or a second erasing step fails very rarely (i.e., a variable resistance layer does not change to a desired resistance state). Such failure in writing can be detected by performing a verification step for verifying whether or not a variable resistance element changes to a desired resistance state after a voltage pulse is applied to the variable resistance element (e.g., to a low resistance state after the second writing step).

Without going into detail, other experimental results show that, when such a failure is detected, good variable resistance characteristics can be recovered by performing (i) a recovery writing step for applying a recovery writing voltage pulse having the same conditions as the first writing voltage pulse in the above-mentioned first writing step and (ii) a recovery erasing step for applying a recovery erasing voltage pulse having the same conditions as the first erasing voltage pulse in the above-mentioned first erasing step in this order.

Here, more specifically, the conditions of the recovery writing voltage pulse and the recover erasing voltage pulse are that $|Vw3|>|Vw2|$, $|Ve3|>|Ve2|$, and $tw3<te3$, where a voltage value and a pulse width of the recovery writing voltage pulse are $Vw3$ and $tw3$, respectively, a voltage value and a pulse width of the recovery erasing voltage pulse are $Ve3$ and $te3$, respectively, a voltage value of the second writing voltage pulse is $Vw2$, and a voltage value of a second erasing voltage pulse is $Ve2$.

Thus, the present invention includes a method of programming a variable resistance element and a nonvolatile storage device performing such a method in which a recovery writing step in which a recovery writing voltage pulse satisfying the above conditions is used and a recovery erasing step in which a recovery erasing voltage pulse satisfying the above conditions is used are performed when the change to the desired resistance state is unsuccessful in at least one of the second writing step and the second erasing step.

It is to be noted that the variable resistance layer comprises stacked tantalum oxide layers in each of the above embodiments, but the present invention is not limited to the above. The variable resistance layer may comprise stacked oxygen-deficient transition metal oxides. For example, the variable resistance layer may comprise stacked hafnium (Hf) oxide layers, or stacked zirconium (Zr) oxide layers.

When the variable resistance layer comprises the stacked hafnium oxide layers, the following is preferable. Assuming that a composition of a first hafnium oxide layer is expressed as $HfO_x$ and a composition of a second hafnium oxide layer is expressed as $HfO_y$, it is preferred that x is within a range approximately from 0.9 to 1.6, that y is within a range approximately from 1.89 to 1.97, and that the first and second hafnium oxide layers are oxygen-deficient compositions in comparison with stoichiometric compositions. Moreover, it is preferred that a film thickness of the second hafnium oxide layer is between 3 and 4 nm inclusive.

When the variable resistance layer comprises the stacked zirconium oxide layers, the following is preferable. Assuming that a composition of a first zirconium oxide layer is expressed as $ZrO_x$ and a composition of a second zirconium oxide layer is expressed as $ZrO_y$, it is preferred that x is within a range approximately from 0.9 to 1.4, that y is within a range approximately from 1.8 to 2, and that the first and second zirconium oxide layers are oxygen-deficient compositions in comparison with stoichiometric compositions. Moreover, it is preferred that a film thickness of the second zirconium oxide layer is between 1 and 5 nm inclusive.

The above-described oxygen-deficient hafnium oxides and oxygen-deficient zirconium oxides can be formed through the same method as that for the above-described oxygen-deficient tantalum oxides described in the above embodiments.

Other materials such as titanium (Ti), niobium (Nb), and tungsten (W) can be used as the transition metal comprised in the variable resistance layer. The transition metal can be in oxidation states, and thus makes it possible to achieve a different resistance state through oxidation-reduction reaction.

Furthermore, in FIG. 1, in the variable resistance layer 3 having the stacked structure, mutually different materials may be used for the first transition metal comprised in the first transition metal oxide layer 3a and the second transition metal comprised in the second transition metal oxide layer 3b. In this case, it is preferred that the second transition metal oxide layer 3b has a degree of oxygen deficiency lower than that of the first transition metal oxide layer 3a, that is, a resistance higher than that of the first transition metal oxide layer 3a.

With this configuration, a voltage applied between the upper electrode 4 and the lower electrode 2 at the time of a resistance change is distributed more to the second transition metal oxide layer 3b, which allows oxidation-reduction reaction to easily occur in the second transition metal oxide layer 3b.

Moreover, when the first transition metal oxide layer comprises the material different from the material of the second transition metal oxide layer, it is preferred that a standard electrode potential of the second transition metal is lower than that of the first transition metal. For instance, the first transition metal oxide layer 3a comprises an oxygen-deficient tantalum oxide and the second transition metal oxide layer 3b comprises $TiO_2$, thereby achieving stable resistance change operation. Titan (standard electrode potential=−1.63 eV) has a standard electrode potential lower than that of tantalum (standard electrode potential=−0.6 eV).

The standard electrode potential indicates characteristics that the larger its value is, the more easily oxidation does not occur. The second transition metal oxide layer 3b comprises an oxide of a metal having a standard electrode potential lower than that of the metal comprised in the first transition metal oxide layer 3a, which allows the oxidation-reduction reaction to easily occur in the second transition metal oxide layer 3b.

It is considered that the resistance change phenomenon in the variable resistance film having the stacked structure of each above-described material is caused by a change of the resistance value of the second transition metal oxide layer 3b having high resistance which is caused by oxidation-reduction reaction occurring in a tiny filament formed in the second transition metal oxide layer 3b.

Moreover, the upper electrode 4 comprises, for example, platinum (Pt) or iridium (Ir), that is, a material having a standard electrode potential higher than the transition metal comprised in the second transition metal oxide layer or the material comprised in the lower electrode 2. With this configuration, oxidation-reduction reaction selectively occurs in the second transition metal oxide layer 3b near an interface between the upper electrode 4 and the second transition metal oxide layer 3b, thereby achieving the resistance change phenomenon.

It is to be noted that a composition of a transition metal oxide can be analyzed by using Auger Electron Spectroscopy (AES), X-ray Photoelectron Spectroscopy (XPS), Rutherford Backscattering Spectrometry (RBS), and the like, and the best method for analyzing absolute values of compositions most precisely is the RBS. Regarding the above-described hafnium oxide and zirconium oxide, the RBS is used for the composition analysis for each of the transition metal oxides.

Industrial Applicability

The method of programming a variable resistance element and the nonvolatile storage device according to the present invention are useful as, for instance, methods of programming a variable resistance element and storage devices that are used in various electronic devices such as personal computers and cellular phones.

REFERENCE SIGNS LIST

1 Substrate
2 Lower electrode
3 Variable resistance layer
3a First transition metal oxide layer (first tantalum oxide layer)
3b Second transition metal oxide layer (second tantalum oxide layer)
4 Upper electrode
5 Power source
10 Variable resistance element
11 First terminal
12 Second terminal
100 Nonvolatile storage device6
101 Memory array
102 Address buffer
103 Control unit
104 Row decoder
105 Word line driver
106 Column decoder
107 Bit line driver
108 Drive unit
W101, W102, W103 Word lines
B101, B102, B103 Bit lines
MC111, MC112, MC113, MC121, MC122, MC123, MC131, MC132, MC133 Memory cells
D111, D112, D113, D121, D122, D123, D131, D132, D133 Current steering elements
200 Nonvolatile storage device
201 Memory array
202 Address buffer
203 Control unit
204 Row decoder
205 Word line driver
206 Column decoder
207 Bit line/plate line driver
208 Drive unit
W201, W202 Word lines
B201, B202 Bit lines
P201, P202 Plate lines
MC211, MC212, MC221, MC222 Memory cells
T211, T212, T221, T222 Transistors

The invention claimed is:
1. A method of programming a variable resistance element which includes a transition metal oxide having resistance values that increase and decrease according to applied electric pulses,
the transition metal oxide comprising a first transition metal oxide layer and a second transition metal oxide layer which are stacked, the second transition metal oxide layer having a degree of oxygen deficiency smaller than a degree of oxygen deficiency of the first transition metal oxide layer, said method comprising:

performing at least one writing step by applying a writing voltage pulse having a first polarity to the transition metal oxide so as to change a resistance state of the transition metal oxide from high to low; and performing at least one erasing step by applying an erasing voltage pulse having a second polarity to the transition metal oxide so as to change the resistance state of the transition metal oxide from low to high, the second polarity being different from the first polarity, wherein $|Vw1|>|Vw2|$ is satisfied, where Vw1 represents a voltage value of the writing voltage pulse for first to N-th writing steps, and Vw2 represents a voltage value of the writing voltage pulse for (N+1)-th and subsequent writing steps, where N is equal to or more than 1, te1>te2 is satisfied, where te1 represents a pulse width of the erasing voltage pulse for first to M-th erasing steps, and te2 represents a pulse width of the erasing voltage pulse for (M+1)-th and subsequent erasing steps, where M is equal to or more than 1, and the (N+1)-th writing step follows the M-th erasing step.

2. The method of programming a variable resistance element according to claim 1, wherein $|Ve1|>|Ve2|$ is further satisfied, where Ve1 represents a voltage value of the erasing voltage pulse for the first to M-th erasing steps, and Ve2 represents a voltage value of the erasing voltage pulse for the (M+1)-th and subsequent erasing steps.

3. The method of programming a variable resistance element according to claim 1, wherein $tw1<te1$ is further satisfied, where tw1 represents a pulse width of the writing voltage pulse for the first to N-th writing steps.

4. The method of programming a variable resistance element according to claim 1, wherein $te2 \times 10 \leq te1$ is further satisfied.

5. The method of programming a variable resistance element according to claim 1, wherein $|Ve1| \geq |Vw1|$ and $|Ve2| \geq |Vw2|$ are further satisfied.

6. The method of programming a variable resistance element according to claim 1, wherein the second transition metal oxide layer has a resistance value larger than a resistance value of the first transition metal oxide layer.

7. The method of programming a variable resistance element according to claim 1, wherein a first transition metal comprising the first transition metal oxide layer is different from a second transition metal comprising the second transition metal oxide layer, and the second transition metal has a standard electrode potential lower than a standard electrode potential of the first transition metal.

8. The method of programming a variable resistance element according to claim 1, wherein the first transition metal oxide layer comprises a tantalum oxide having a composition represented by $TaO_x$, where $0.8 \leq x \leq 1.9$, and the second transition metal oxide layer comprises a tantalum oxide having a composition represented by $TaO_y$, where $2.1 \leq y < 2.5$.

9. A nonvolatile storage device comprising:
a first electrode;
a second electrode;
a variable resistance element which is provided between said first electrode and said second electrode, and includes a transition metal oxide having resistance values that increase and decrease according to electric pulses applied between said first and said second electrodes; and
a drive unit, wherein the transition metal oxide comprises a first transition metal oxide layer and a second transition metal oxide layer which are stacked, the second transition metal oxide layer having a degree of oxygen deficiency smaller than a degree of oxygen deficiency of the first transition metal oxide layer, said drive unit is configured to perform:

a writing step by applying a writing voltage pulse having a first polarity between said first electrode and said second electrode so as to change a resistance state of the transition metal oxide from high to low; and an erasing step by applying an erasing voltage pulse having a second polarity between said first electrode and said second electrode so as to change the resistance state of the transition metal oxide from low to high, the second polarity being different from the first polarity, $|Vw1|>|Vw2|$ is satisfied, where Vw1 represents a voltage value of the writing voltage pulse for first to N-th writing steps, and Vw2 represents a voltage value of the writing voltage pulse for (N+1)-th and subsequent writing steps, where N is equal to or more than 1, te1>te2 is satisfied, where te1 represents a pulse width of the erasing voltage pulse for first to M-th erasing steps, and te2 represents a pulse width of the erasing voltage pulse for (M+1)-th and subsequent erasing steps, where M is equal to or more than 1, and the (N+1)-th writing step follows the M-th erasing step.

10. The volatile storage device according to claim 9, wherein $|Ve1|>|Ve2|$ is further satisfied, where Ve1 represents a voltage value of the erasing voltage pulse for the first to M-th erasing steps, and Ve2 represents a voltage value of the erasing voltage pulse for the (M+1)-th and subsequent erasing steps.

11. The volatile storage device according to claim 9, $tw1<te1$ is further satisfied, where tw1 represents a pulse width of the writing voltage pulse for the first to N-th writing steps.

12. The volatile storage device according to claim 9, wherein $te2 \times 10 < te1$ is further satisfied.

13. The nonvolatile storage device according to claim 9, wherein $|Ve1|>|Vw1|$ and $|Ve2|>|Vw2|$ are further satisfied.

14. The volatile storage device according to claim 9, wherein the second transition metal oxide layer has a resistance value larger than a resistance value of the first transition metal oxide layer.

15. The volatile storage device according to claim 9, wherein a first transition metal comprising the first transition metal oxide layer is different from a second transition metal comprising the second transition metal oxide layer, and the second transition metal has a standard electrode potential lower than a standard electrode potential of the first transition metal.

16. The volatile storage device according to claim 9, wherein the first transition metal oxide layer comprises a tantalum oxide having a composition represented by $TaO_x$, where $0.8 \leq x \leq 1.9$, and the second transition metal oxide layer comprises a tantalum oxide having a composition represented by $TaO_y$, where $2.1 \leq y < 2.5$.

17. The volatile storage device according to claim 9, further comprising
 a current steering element electrically connected to one of said first electrode and said second electrode.

18. The volatile storage device according to claim 17, wherein said current steering element is a selection transistor.

19. The volatile storage device according to claim 17, wherein said current steering element is a diode.

20. A method of initializing a variable resistance element which includes a transition metal oxide having resistance values that increase and decrease according to applied electric pulses,
 wherein the transition metal oxide comprises a first transition metal oxide layer and a second transition metal oxide layer which are stacked, the second transition metal oxide layer having a degree of oxygen deficiency smaller than a degree of oxygen deficiency of the first transition metal oxide layer,
 in the case where data is written to and erased from the variable resistance element, by repeating in sequence: a writing step by applying, to the transition metal oxide, a writing voltage pulse having a first polarity and a voltage value Vw2 so as to change a resistance state of the transition metal oxide from high to low; and an erasing step by applying, to the transition metal oxide, an erasing voltage pulse having a second polarity and a pulse width te2 so as to change the resistance state of the transition metal oxide from low to high, the second polarity being different from the first polarity, said method comprising:
 performing at least one initial writing step by applying, to the transition metal oxide, a voltage pulse having the first polarity and a voltage value Vw1 satisfying |Vw1|>|Vw2| so as to change a resistance state of the transition metal oxide from high to low; and
 subsequently performing at least one initial erasing step by applying, to the transition metal oxide, an erasing voltage pulse having the second polarity and a pulse width te1 satisfying te1>te2 so as to change the resistance state of the transition metal oxide from low to high, wherein a first one of the repeated writing steps follows a last one of the at least one initial erasing step.

* * * * *